(12) United States Patent  
Kim et al.

(10) Patent No.: US 11,056,654 B2  
(45) Date of Patent: Jul. 6, 2021

(54) CARBAZOLE-BASED COMPOUND AND ORGANIC LIGHT EMITTING DEVICE INCLUDING THE SAME

(71) Applicant: SAMSUNG DISPLAY CO., LTD., Yongin (KR)

(72) Inventors: Myeong-Suk Kim, Yongin (KR); Yoon-Hyun Kwak, Yongin (KR); Soung-Wook Kim, Yongin (KR); Jae-Hong Kim, Yongin (KR); Moon-Jae Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 464 days.

(21) Appl. No.: 14/533,606

(22) Filed: Nov. 5, 2014

(65) Prior Publication Data

US 2015/0311451 A1    Oct. 29, 2015

(30) Foreign Application Priority Data

Apr. 25, 2014    (KR) .......................... 10-2014-050179

(51) Int. Cl.
```
H01L 51/50     (2006.01)
H01L 51/00     (2006.01)
C09K 11/06     (2006.01)
```

(52) U.S. Cl.
CPC .......... H01L 51/0072 (2013.01); C09K 11/06 (2013.01); H01L 51/0074 (2013.01); H01L 51/5096 (2013.01)

(58) Field of Classification Search  
None  
See application file for complete search history.

(56) References Cited

U.S. PATENT DOCUMENTS

| | | | | |
|---|---|---|---|---|
| 2003/0137239 A1* | 7/2003 | Matsuura | ............ | H01L 51/5016 313/503 |
| 2005/0208331 A1* | 9/2005 | Maeda | ............... | C09K 19/3847 428/690 |
| 2014/0175406 A1* | 6/2014 | Lee | .................... | H01L 51/0094 257/40 |

FOREIGN PATENT DOCUMENTS

| | | | | |
|---|---|---|---|---|
| CN | 103709153 | * | 9/2012 | ............ H01L 51/54 |
| JP | 2011-174025 | * | 9/2011 | ............ H01L 51/50 |

(Continued)

OTHER PUBLICATIONS

Bin et al., New sulfur-containing host materials for blue phosphorescent organic light-emitting diodes; 2012, Journal of Materials Chemistry; vol. 22(40), pp. 21720-21726.*

Bin et al., New sulfur-containing host materials for blue phosphorescent organic light-emitting diodes, 2012, J. of Materials Chemistry, 22(40), 21720-21726. (Year: 2012).*

Promarak et al., Multibromo-N-alkylcarbazoles: synthesis, characterization, and their benzo[b]thiophene derivatives; Tetrahedron Letters (2012), 53(34), 4568-4572 (Year: 2012).*

*Primary Examiner* — Gregory D Clark  
(74) *Attorney, Agent, or Firm* — Lewis Roca Rothgerber Christie LLP

(57) ABSTRACT

A carbazole-based compound and an organic light-emitting device including the carbazole-based compound, the compound being represented by one of the following Formulae 1 to 3:

[Formula 1]

[Formula 2]

(Continued)

-continued

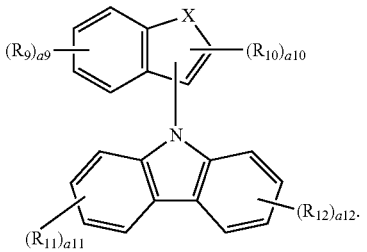

[Formula 3]

17 Claims, 1 Drawing Sheet

(56) References Cited

FOREIGN PATENT DOCUMENTS

| JP | 2011174025 | * | 9/2011 | ............. | H01L 51/50 |
| JP | 2012-089777 | * | 5/2012 | ............. | H01L 51/50 |
| KR | 10-2008-0047211 A | | 5/2008 | | |
| KR | 10-2010-0015029 A | | 2/2010 | | |
| WO | WO 2014/014310 | * | 1/2014 | ............. | H01L 51/54 |

* cited by examiner

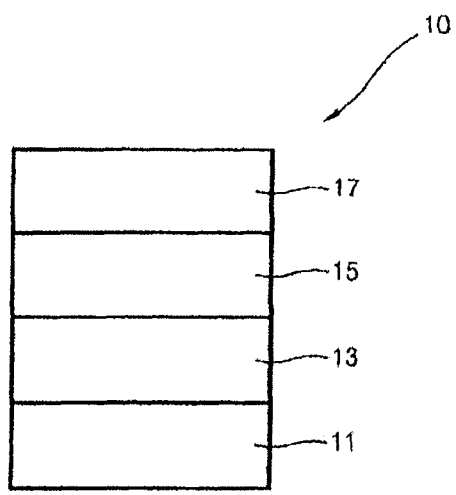

CARBAZOLE-BASED COMPOUND AND ORGANIC LIGHT EMITTING DEVICE INCLUDING THE SAME

CROSS-REFERENCE TO RELATED APPLICATION

Korean Patent Application No. 10-2014-0050179, filed on Apr. 25, 2014, in the Korean Intellectual Property Office, and entitled: "Carbazole-Based Compound and Organic Light Emitting Device Including the Same," is incorporated by reference herein in its entirety.

BACKGROUND

1. Field

Embodiments relate to a carbazole-based compound and an organic light-emitting device including the same.

2. Description of the Related Art

Organic light emitting devices are self-emission devices that have wide viewing angles, a high contrast ratio, short response times, and excellent brightness, driving voltage, and response speed characteristics, and produce full-color images.

The organic light-emitting device may have a structure in which an anode is formed on a substrate and a hole transport layer, an emission layer, an electron transport layer, and a cathode are sequentially formed on the anode. In this regard, the hole transport layer, the emission layer, and the electron transport layer may be organic thin films formed of organic compounds.

A driving principle of the organic light-emitting device having the structure described above is as follows.

When voltage is applied to the anode and the cathode, holes injected from the anode may move to the emission layer via the hole transport layer and electrons injected from the cathode may move to the emission layer via the electron transport layer. Carriers such as holes and electrons may be recombined in the emission layer to produce excitons. These excitons may change from an excited state to a ground state, thereby generating light.

SUMMARY

Embodiments are directed to a carbazole-based compound and an organic light-emitting device including the same.

According to one or more embodiments, provided is a carbazole-based compound represented by any one of Formulae 1 to 3:

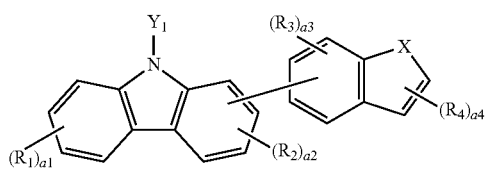

[Formula 1]

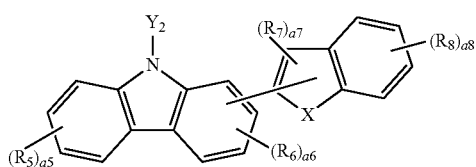

[Formula 2]

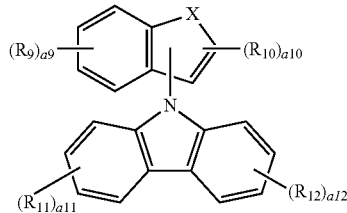

[Formula 3]

In Formulae 1 to 3,

X may be an oxygen atom (O) or a sulfur atom (S);

$Y_1$ and $Y_2$ may be each independently selected from a hydrogen atom, a deuterium atom, a substituted or unsubstituted $C_1$-$C_{60}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{30}$ aryl group, and a substituted or unsubstituted $C_1$-$C_{30}$ heteroaryl group;

$R_1$ to $R_{12}$ may be each independently selected from a hydrogen atom, a deuterium atom, a halogen atom, a cyano group, a nitro group, a hydroxy group, a carboxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{60}$ cycloalkyl group, a substituted or unsubstituted $C_3$-$C_{60}$ cycloalkylene group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arythio group, a substituted or unsubstituted $C_1$-$C_{60}$ heteroaryl group, and —N($Q_1$)($Q_2$) (wherein, $Q_1$ and $Q_2$ may be each independently selected from a hydrogen atom, a deuterium atom, a $C_1$-$C_{10}$ alkyl group, a $C_6$-$C_{30}$ aryl group, and a $C_1$-$C_{30}$ heteroaryl group; and $Q_1$ and $Q_2$ may bind together to form a saturated or an unsaturated ring including N, $Q_1$, and $Q_2$);

a1, a5, a8, a9, a11 and a12 may be each independently integers from 1 to 4;

a2, a3, a6 may be each independently integers from 1 to 3;

a4 may be an integer of 1 to 2; and a7 and a10 may be each independently an integer of 1.

According to another embodiment, provided is an organic light-emitting device comprising a substrate; a first electrode; a second electrode disposed opposite to the first electrode; and an organic layer disposed between the first electrode and the second electrode and includes an emission layer, wherein the organic layer includes at least one carbazole-based compound.

BRIEF DESCRIPTION OF THE DRAWING

Features will be apparent to those of skill in the art by describing in detail exemplary embodiments with reference to the attached drawing in which:

The FIGURE illustrates an organic light-emitting device according to an embodiment.

DETAILED DESCRIPTION

Example embodiments will now be described more fully hereinafter with reference to the accompanying drawing;

however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

In an embodiment, the carbazole-based compound may be represented by any one of Formulae 1 to 3.

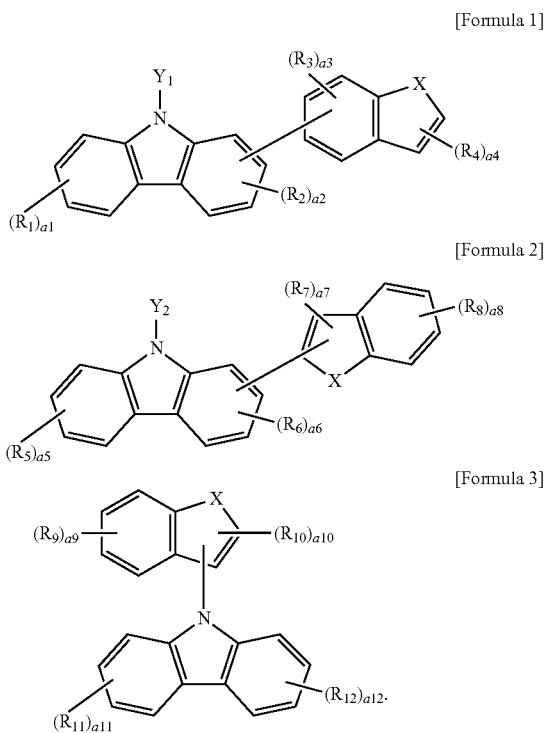

[Formula 1]

[Formula 2]

[Formula 3]

In Formulae 1 to 3, X may be an oxygen atom or a sulfur (S) atom.

In an implementation, in Formulae 1 to 3, X may be an S atom.

In Formulae 1 to 3, $Y_1$ and $Y_2$ may be each independently a hydrogen atom, a deuterium atom, a substituted or unsubstituted $C_1$-$C_{60}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{30}$ aryl group, and a substituted or unsubstituted $C_1$-$C_{30}$ heteroaryl group.

For example, in Formulae 1 to 3, $Y_1$ and $Y_2$ may be each independently selected from:

i) a hydrogen atom, a deuterium atom, a $C_1$-$C_{20}$ alkyl group, a cyclopropyl group, a cyclobutyl group, a cyclopentyl group, a cyclohexyl group, a cycloheptyl group, a cyclooctyl group, a cyclopentenyl group, a cyclopentadienyl group, a cyclohexenyl group, a cyclohexadienyl group, a cycloheptadienyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridyl group, a pyrazinyl group, a pyrimidinyl group, a pyridazinyl group, an isoindolyl group, an indolyl group, an indazolyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a furanyl group, a benzofuranyl group, a thiophenyl group, a benzothiophenyl group, a thiazolyl group, an isothiazolyl group, a benzothiazolyl group, an isooxazolyl group, an oxazolyl group, a triazolyl group, a tetrazolyl group, an oxadiazolyl group, a triazinyl group, a benzooxazolyl group, a dibenzofuranyl group, and a dibenzothiophenyl group; and ii) a $C_1$-$C_{20}$ alkyl group, a cyclopropyl group, a cyclobutyl group, a cyclopentyl group, a cyclohexyl group, a cycloheptyl group, a cyclooctyl group, a cyclopentenyl group, a cyclopentadienyl group, a cyclohexenyl group, a cyclohexadienyl group, a cycloheptadienyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridyl group, a pyrazinyl group, a pyrimidinyl group, a pyridazinyl group, an isoindolyl group, an indolyl group, an indazolyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a furanyl group, a benzofuranyl group, a thiophenyl group, a benzothiophenyl group, a thiazolyl group, an isothiazolyl group, a benzothiazolyl group, an isooxazolyl group, an oxazolyl group, a triazolyl group, a tetrazolyl group, an oxadiazolyl group, a triazinyl group, a benzooxazolyl group, a dibenzofuranyl group, and a dibenzothiophenyl group, each substituted with at least one of a deuterium, a halogen atom, a hydroxyl group, a cyano group, a nitro group, a $C_1$-$C_{20}$ alkyl group, a $C_1$-$C_{20}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{30}$ aryl group, a $C_6$-$C_{30}$ aryloxy group, a $C_6$-$C_{30}$ arylthio group, and a $C_1$-$C_{30}$ heteroaryl group, but they are not limited thereto.

In another embodiment, in Formulae 1 to 3, $Y_1$ and $Y_2$ may be each independently selected from:

i) a phenyl group, a naphthyl group, a fluorenyl group, a spiro-fluorenyl group, a phenanthrenyl group, an anthryl group, a fluoranthenyl group, a triphenylenyl group, a pyrenyl group, and a chrysenyl group; and ii) a phenyl group, a naphthyl group, a fluorenyl group, a spiro-fluorenyl group, a phenanthrenyl group, an anthryl group, a fluoranthenyl group, a triphenylenyl group, a pyrenyl group, and a chrysenyl group, each substituted with at least one of a deuterium, —F, a cyano group, a nitro group, a methyl group, an ethyl group, an n-propyl group, isopropyl group, an n-butyl group, a sec-butyl group, iso-butyl group, a tert-butyl group, a phenyl group, a naphthyl group, and an anthryl group; but, they are not limited thereto.

In another embodiment, in Formulae 1 to 3, $Y_1$ and $Y_2$ may be each independently selected from:

i) a phenyl group, a 1-naphthyl group, a 2-naphthyl group, a 1-fluorenyl group, a 2-fluorenyl group, a 3-fluorenyl group, and a 4-fluorenyl group; and ii) a phenyl group, a 1-naphthyl group, a 2-naphthyl group, a 1-fluorenyl group, a 2-fluorenyl group, a 3-fluorenyl group, and a 4-fluorenyl group, each substituted with at least one of a deuterium, a methyl group, an ethyl group, a phenyl group, a 1-naphthyl group, and a 2-naphthyl group; but, they are not limited thereto.

In another embodiment, in Formulae 1 to 3, $Y_1$ and $Y_2$ may be each independently represented by one of Formulae 4-1 to 4-4 below, but they are not limited thereto.

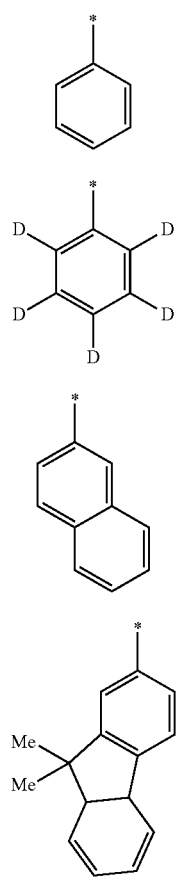

In Formulae 4-1 to 4-4, * may be a binding site to an N of a carbazole ring.

In Formulae 1 to 3, $R_1$ to $R_{12}$ may be each independently selected from a hydrogen atom, a deuterium atom, a halogen atom, a cyano group, a nitro group, a hydroxy group, a carboxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{60}$ cycloalkyl group, a substituted or unsubstituted $C_3$-$C_{60}$ cycloalkylene group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arythio group, a substituted or unsubstituted $C_1$-$C_{60}$ heteroaryl group, and —N($Q_1$)($Q_2$), in which $Q_1$ and $Q_2$ may be each independently selected from a hydrogen atom, a deuterium atom, $C_1$-$C_{10}$ alkyl group, a $C_6$-$C_{30}$ aryl group, and a $C_1$-$C_{30}$ heteroaryl group. In an implementation, $Q_1$ and $Q_2$ may bind to each other to form a saturated ring or an unsaturated ring formed of N, $Q_1$ and $Q_2$.

In an implementation, in Formulae 1 to 3, $R_1$ to $R_{12}$ may be each independently selected from:

i) a hydrogen atom, a deuterium atom, a halogen atom, a cyano group, a nitro group, a hydroxy group, $C_1$-$C_{20}$ alkyl group, a cyclopropyl group, a cyclobutyl group, a cyclopentyl group, a cyclohexyl group, a cycloheptyl group, a cyclooctyl group, a cyclopentenyl group, a cyclopentadienyl group, a cyclohexenyl group, a cyclohexadienyl group, a cycloheptadienyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group. a picenyl group, a perylenyl group, a pentaphenyl group, a hexacenyl group, a pyrrolyl group, an imidazolyl group, a pyrazolyl group, a pyridyl group, a pyrazinyl group, a pyrimidinyl group, a pyridazinyl group, an isoindolyl group, an indolyl group, an indazolyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a furanyl group, a benzofuranyl group, a thiophenyl group, a benzothiophenyl group, a thiazolyl group, an isothiazolyl group, a benzothiazolyl group, an isooxazolyl group, an oxazolyl group, a triazolyl group, a tetrazolyl group, an oxadiazolyl group, a triazinyl group, a benzooxazolyl group, a dibenzofuranyl group, a dibenzothiophenyl group, and —N($Q_1$)($Q_2$) (wherein, $Q_1$ and $Q_2$ may be each independently selected from a $C_6$-$C_{30}$ aryl group and a $C_1$-$C_{30}$ heteroaryl group); and ii) a $C_1$-$C_{20}$ alkyl group, a cyclopropyl group, a cyclobutyl group, a cyclopentyl group, a cyclohexyl group, a cycloheptyl group, a cyclooctyl group, a cyclopentenyl group, a cyclopentadienyl group, a cyclohexenyl group, a cyclohexadienyl group, a cycloheptadienyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridyl group, a pyrazinyl group, a pyrimidinyl group, a pyridazinyl group, an isoindolyl group, an indolyl group, an indazolyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a furanyl group, a benzofuranyl group, a thiophenyl group, a benzothiophenyl group, a thiazolyl group, an isothiazolyl group, a benzothiazolyl group, an isooxazolyl group, an oxazolyl group, a triazolyl group, a tetrazolyl group, an oxadiazolyl group, a triazinyl group, a benzooxazolyl group, a dibenzofuranyl group, and a dibenzothiophenyl group, each substituted with at least one of a deuterium, a halogen atom, a hydroxyl group, a cyano group, a nitro group, a $C_1$-$C_{20}$ alkyl group, a $C_1$-$C_{20}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{30}$ aryl group, a $C_6$-$C_{30}$ aryloxy group, a $C_6$-$C_{30}$ arylthio group, and a $C_1$-$C_{30}$ heteroaryl group; but, they are not limited thereto.

In another embodiment, in Formulae 1 to 3, $R_1$ to $R_{12}$ may be each independently selected from:

i) a hydrogen atom, a deuterium atom, —F, a cyano group, a nitro group, a hydroxy group, a methyl group, an ethyl group, an n-propyl group, an iso-propyl group, an n-butyl group, a sec-butyl group, an iso-butyl group, a tert-butyl group, a cyclopentyl group, a cyclohexyl group, a cyclopentenyl group, a cyclohexenyl group, a cycloheptadienyl group, a phenyl group, a naphthyl group, a fluorenyl group, a spiro-fluorenyl group, a phenanthrenyl group, an anthryl group, a triphenylenyl group, a pyrenyl group, a chrysenyl group, a pyrrolyl group, an imidazolyl group, a pyrazolyl group, a pyridyl group, a pyrazinyl group, a pyrimidinyl group, a pyridazinyl group, an isoindolyl group, an indolyl group, a quinolinyl group, a carbazolyl group, a furanyl group, a benzofuranyl group, a thiophenyl group, a benzothiophenyl group, a thiazolyl group, a benzothiazolyl group, a triazolyl group, a tetrazolyl group, a triazinyl group, and —N($Q_1$)($Q_2$), in which $Q_1$ and $Q_2$ may be each independently selected from a phenyl group, a naphthyl group, an anthryl group, and a fluorenyl group; and ii) a phenyl group, a naphthyl group, a fluorenyl group, a spiro-fluorenyl group, a phenanthrenyl group, an anthryl group, a triphenylenyl group, a pyrenyl group, a chrysenyl group, a pyrrolyl group, an imidazolyl group, a pyrazolyl group, a pyridyl group, a pyrazinyl group, a pyrimidinyl group, a pyridazinyl group, an isoindolyl group, an indolyl group, a quinolinyl group, a carbazolyl group, a furanyl group, a benzofuranyl group, a thiophenyl group, a benzothiophenyl group, a thiazolyl group, a benzothiazolyl group, a triazolyl group, a tetrazolyl group, and a triazinyl group, each substituted with at least one of a deuterium, an —F, a cyano group, a nitro group, a methyl group, an ethyl group, an n-propyl group, iso-propyl group, an n-butyl group, a sec-butyl group, iso-butyl group, a tert-butyl group, a phenyl group, a naphthyl group, and an anthryl group; but, they are not limited thereto.

In another embodiment, in Formulae 1 to 3, $R_1$ to $R_{12}$ may be each independently selected from:

i) a hydrogen atom, a deuterium atom, —F, a cyano group, a nitro group, a methyl group, an ethyl group, a phenyl group, a 1-naphthyl group, a 2-naphthyl group, a 1-fluorenyl group, a 2-fluorenyl group, a 3-fluorenyl group, a 4-fluorenyl group, a 1-carbazolyl group, a 2-carbazolyl group, a 3-carbazolyl group, a 4-carbazolyl group, and —N($Q_1$)($Q_2$), in which $Q_1$ and $Q_2$ may be each independently selected from a phenyl group, and a naphthyl group; and ii) a phenyl group, a 1-naphthyl group, a 2-naphthyl group, a 1-fluorenyl group, a 2-fluorenyl group, a 3-fluorenyl group, a 4-fluorenyl group, a 1-carbazolyl group, a 2-carbazolyl group, a 3-carbazolyl group, and a 4-carbazolyl group, each substituted with at least one of a deuterium, —F, a cyano group, a nitro group, a methyl group, an ethyl group, a phenyl group, a naphthyl group, and an anthryl group; but, they are not limited thereto.

In another embodiment, in Formulae 1 to 3, $R_1$ to $R_{12}$ may be each independently represented by one of the following Formulae 5-1 to 5-8, but they are not limited thereto.

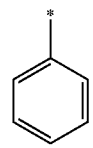

5-1

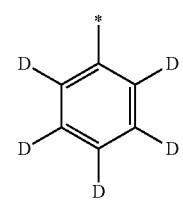

5-2

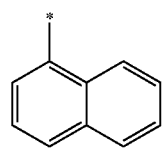

5-3

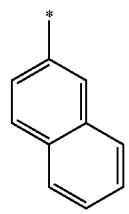

5-4

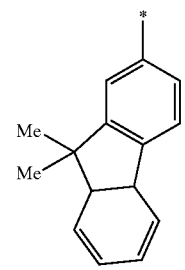

5-5

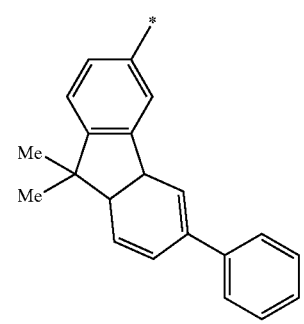

5-6

5-7

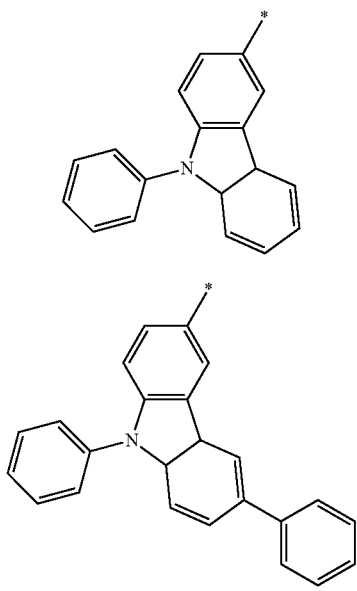

5-8

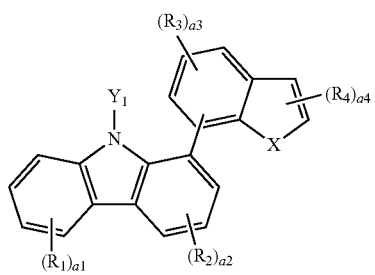

In Formulae 5-1 to 5-8, * is a binding site.

In Formulae 1 to 3, a1 is a number of $R_1$s, a2 is a number of $R_2$s, a3 is a number of $R_3$s, a4 is a number of $R_4$s, a5 is a number of $R_5$s, a6 is a number of $R_6$s, a7 is a number of $R_7$s, a8 is a number of $R_8$s, a9 is a number of $R_9$s, a10 is a number of $R_{10}$s, a11 is a number of $R_{11}$s, and a12 is a number of $R_{12}$s.

In Formulae 1 to 3, when a1 to a12 are 0, each of $R_1$ to $R_{12}$ may not be present or substituted.

In Formulae 1 to 3, a1, a5, a8, a9, a11, and a12 may be each independently integers of 0 to 4; a2, a3, and a6 may be each independently integers of 0 to 3; a4 may be an integer of 0 to 2; and a7 and a10 may be each independently integers of 0 or 1.

The carbazole-based compound may be represented by one of the following Formulae 1a to 1d, 2a to 2d, and 3; but, it is not limited thereto.

<Formula 1a>

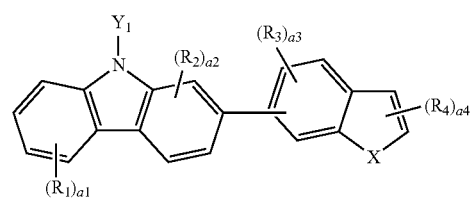

<Formula 1b>

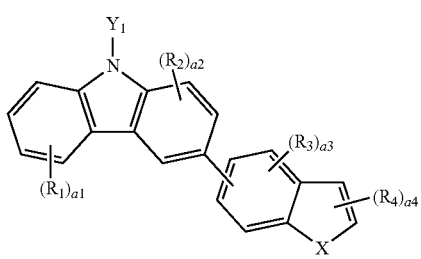

<Formula 1c>

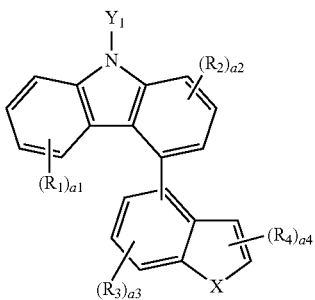

<Formula 1d>

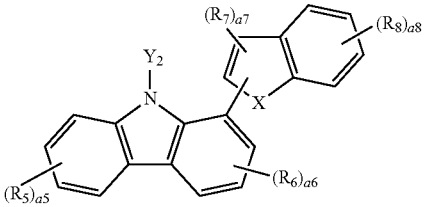

<Formula 2a>

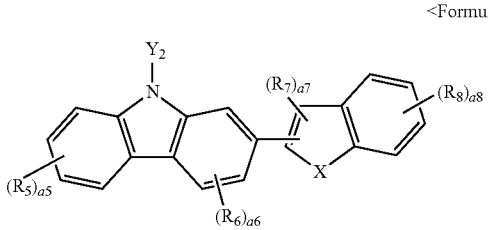

<Formula 2b>

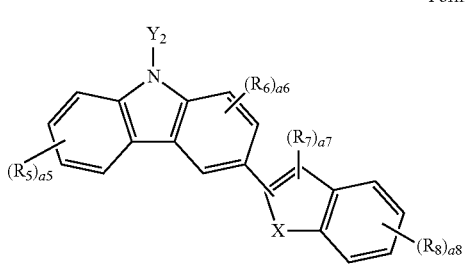

<Formula 2c>

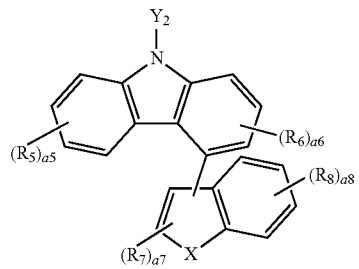

<Formula 2d>

-continued

<Formula 3>

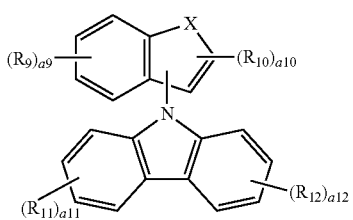

In Formula 1a to 1d, 2a to 2d, and 3, X may be an oxygen atom or a sulfur atom.

$Y_1$ and $Y_2$ may be each independently selected from:

i) a phenyl group, a 1-naphthyl group, a 2-naphthyl group, a 1-fluorenyl group, a 2-fluorenyl group, a 3-fluorenyl group, and a 4-fluorenyl group; and ii) a phenyl group, a 1-naphthyl group, a 2-naphthyl group, a 1-fluorenyl group, a 2-fluorenyl group, a 3-fluorenyl group, and a 4-fluorenyl group, each substituted with at least one of a deuterium, a methyl group, an ethyl group, a phenyl group, a 1-naphthyl group, and a 2-naphthyl group.

$R_1$ to $R_{12}$ may be each independently selected from:

i) a hydrogen atom, a deuterium atom, an —F, a cyano group, a nitro group, a methyl group, an ethyl group, a phenyl group, a naphthyl group, a fluorenyl group, a carbazolyl group, and —$N(Q_1)(Q_2)$, in which $Q_1$ and $Q_2$ may be each independently selected from a phenyl group, and a naphthyl group; and ii) a phenyl group, a naphthyl group, a fluorenyl group, and a carbazolyl group, each substituted with at least one of a deuterium, an —F, a cyano group, a nitro group, a methyl group, an ethyl group, a phenyl group, a naphthyl group, and an anthryl group.

a1, a5, a8, a9, a11, and a12 may be each independently integers of 0 to 4; a2, a3, and a6 may be each independently integers of 0 to 3; a4 may be an integer of 0 to 2; and a7 and a10 may be each independently integers of 0 or 1.

In another embodiment, the carbazole-based compound may be represented by one of the following Formulae 1a to 1d, 2a to 2d, and 3, but it is not limited thereto.

<Formula 1a>

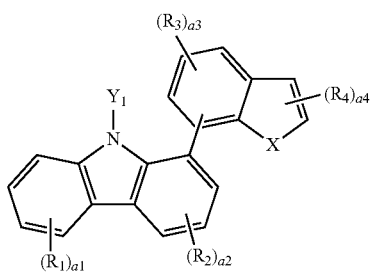

<Formula 1b>

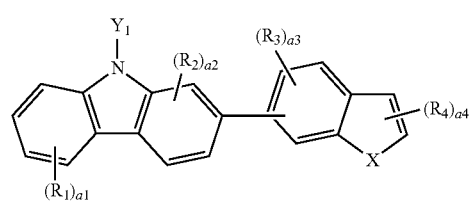

<Formula 1c>

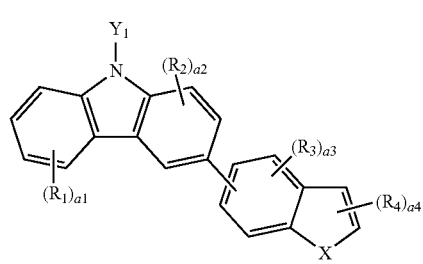

<Formula 1d>

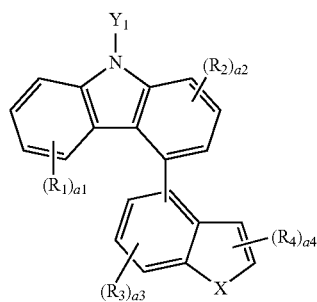

<Formula 2a>

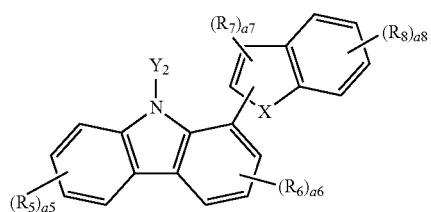

<Formula 2b>

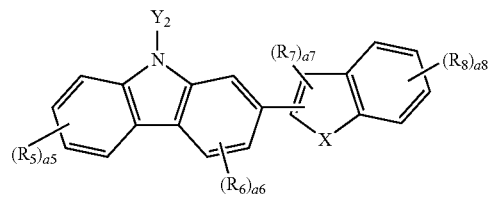

<Formula 2c>

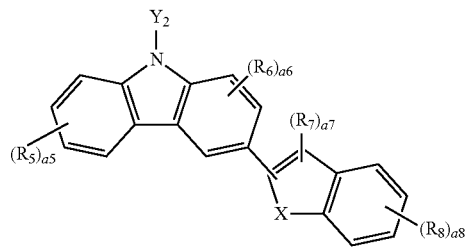

<Formula 2d>

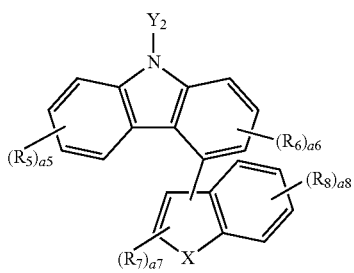

<Formula 3>
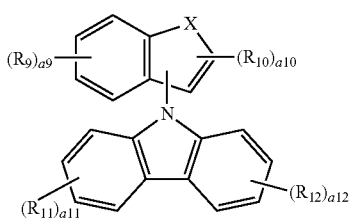
In Formulae 1a to 1d, 2a to 2d, and 3, X may be an oxygen atom or a sulfur atom.
Y₁ and Y₂ may be each independently represented by one of the following Formulae 4-1 to 4-4.
4-1
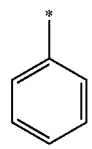
4-2
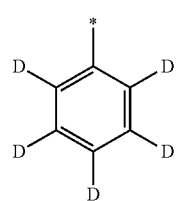
4-3
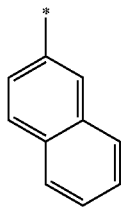
4-4
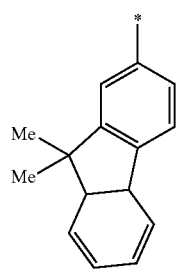
In Formulae 4-1 to 4-4, * may be a binding site to N of a carbazole.
R₁ to R₁₂ may be each independently represented by one of the following Formulae 5-1 to 5-8.
5-1
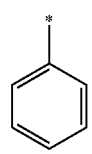
5-2
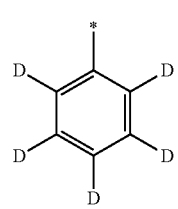
5-3
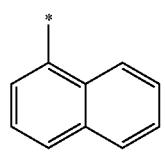
5-4
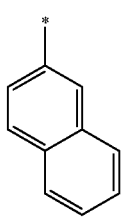
5-5
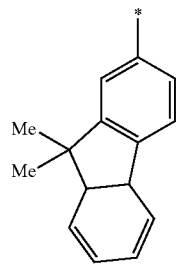
5-6
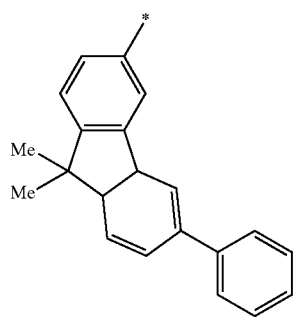
5-7
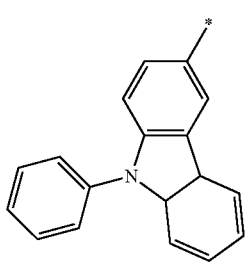

-continued

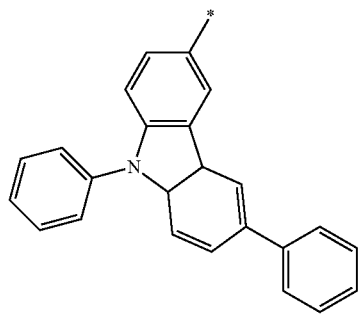

5-8

In Formulae 5-1 to 5-8, * is a binding site.

a1, a5, a8, a9, a11, and a12 may be each independently integers of 0 to 4; a2, a3, and a6 may be each independently integers of 0 to 3; a4 may be an integer of 0 to 2; and a7 and a10 may be each independently integers of 0 or 1.

The carbazole-based compound may be represented by one of the following Formulae 1e to 1h, 2e to 2h, and 3a, but it is not limited thereto.

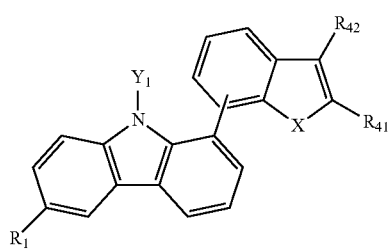

<Formula 1e>

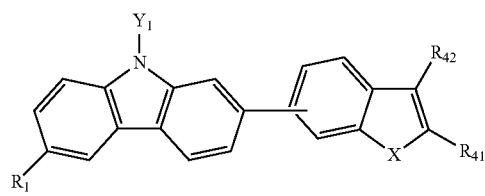

<Formula 1f>

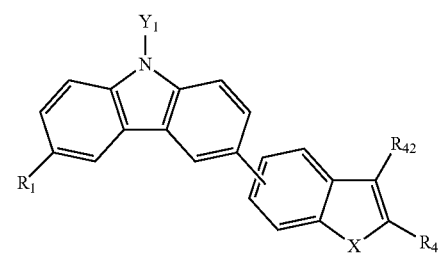

<Formula 1g>

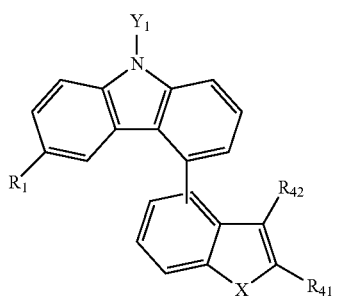

<Formula 1h>

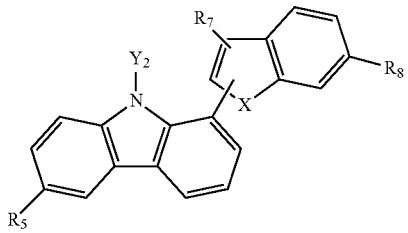

<Formula 2e>

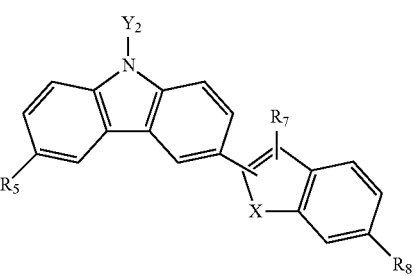

<Formula 2f>

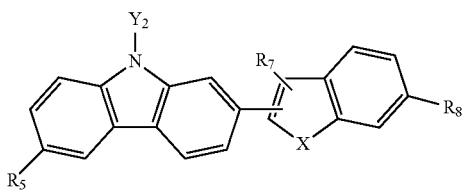

<Formula 2g>

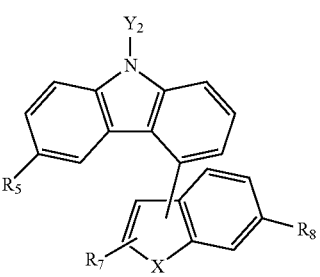

<Formula 2h>

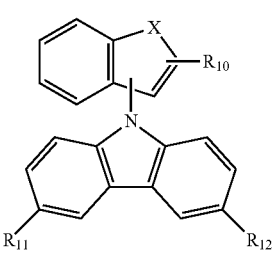

<Formula 3a>

In Formulae 1e to 1h, 2e to 2h, and 3a, X may be an oxygen atom or a sulfur atom.

$Y_1$ and $Y_2$ may be each independently selected from:

i) a phenyl group, a 1-naphthyl group, a 2-naphthyl group, a 1-fluorenyl group, a 2-fluorenyl group, a 3-fluorenyl group, and a 4-fluorenyl group; and ii) a phenyl group, a 1-naphthyl group, a 2-naphthyl group, a 1-fluorenyl group, a 2-fluorenyl group, a 3-fluorenyl group, and a 4-fluorenyl group, each substituted with at least one of a deuterium, a methyl group, an ethyl group, a phenyl group, a 1-naphthyl group, and a 2-naphthyl group.

$R_1$, $R_5$, $R_7$, $R_8$, $R_{10}$, $R_{11}$, $R_{12}$, $R_{41}$ and $R_{42}$ may be each independently selected from:

i) a hydrogen atom, a deuterium atom, —F, a cyano group, a nitro group, a methyl group, an ethyl group, a phenyl group, a naphthyl group, a fluorenyl group, a carbazolyl group, and —N($Q_1$)($Q_2$), in which $Q_1$ and $Q_2$ may be each independently a phenyl group and a naphthyl group; and ii) a phenyl group, a naphthyl group, a fluorenyl group, and a carbazolyl group, each substituted with at least one of a deuterium, —F, a cyano group, a nitro group, a methyl group, an ethyl group, a phenyl group, a naphthyl group, and an anthryl group.

In another embodiment, the carbazole-based compound may be represented by one of the following Formulae 1e to 1h, 2e to 2h, and 3a, but it is not limited thereto.

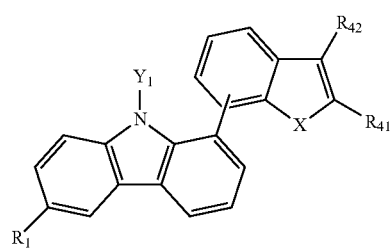
<Formula 1e>

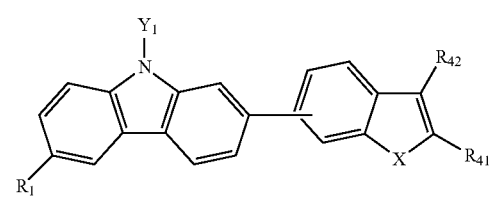
<Formula 1f>

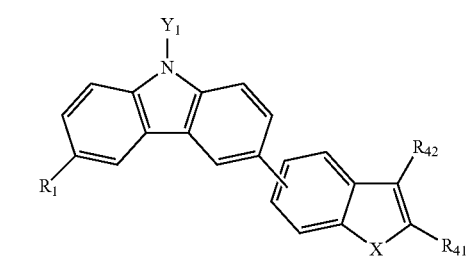
<Formula 1g>

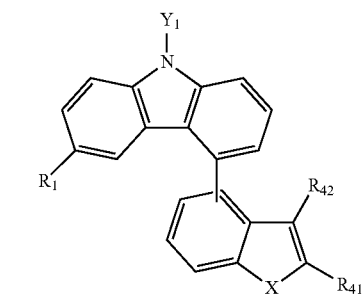
<Formula 1h>

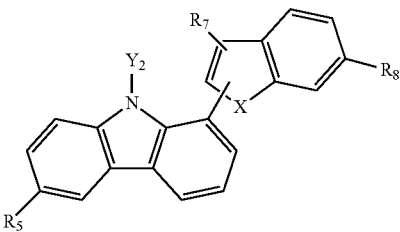
<Formula 2e>

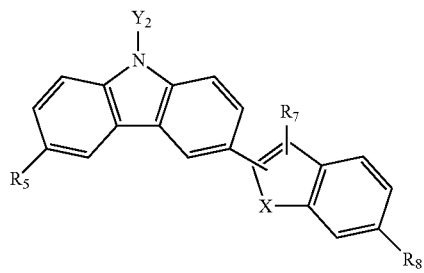
<Formula 2f>

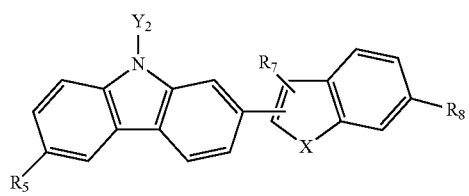
<Formula 2g>

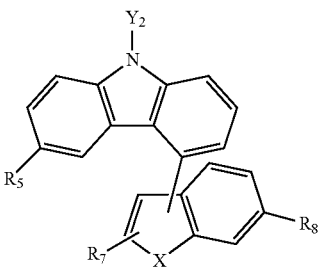
<Formula 2h>

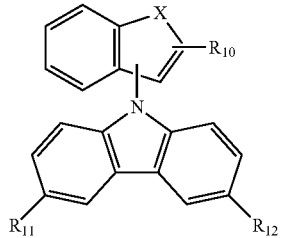
<Formula 3a>

In Formulae 1e to 1h, 2e to 2h, and 3a, X may be an oxygen atom or a sulfur atom.

$Y_1$ and $Y_2$ may be each independently represented by one of the following Formulae 4-1 to 4-4.

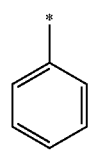
4-1

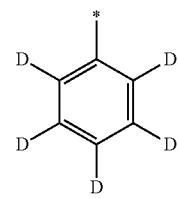
4-2

-continued
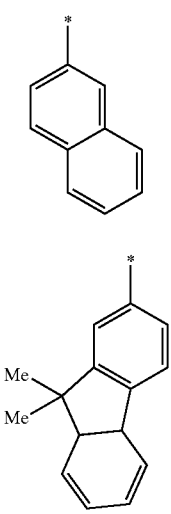
4-3
4-4
In Formulae 4-1 to 4-4, * is a binding site to N of a carbazole ring.
$R_1$, $R_5$, $R_7$, $R_8$, $R_{10}$, $R_{11}$, $R_{12}$, $R_{41}$, and $R_{42}$ may be each independently represented by one of the following Formulae 5-1 to 5-8.
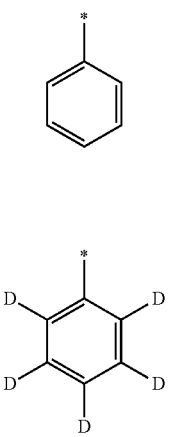
5-1
5-2
5-3
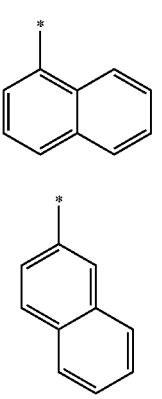
5-4
-continued
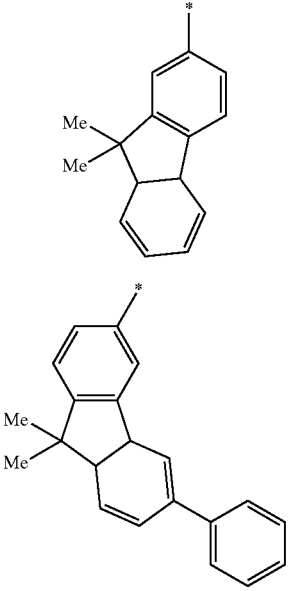
5-5
5-6
5-7
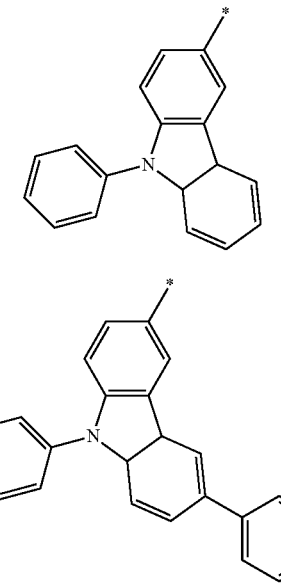
5-8
In Formulae 5-1 to 5-8, * is a binding site.
The carbazole-based compound may be represented by one of the following Formulae 1i, 1j, 2i, and 3b, but it is not limited thereto.
<Formula 1i>
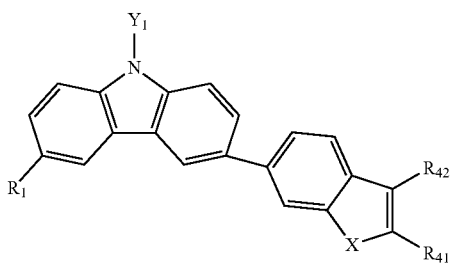

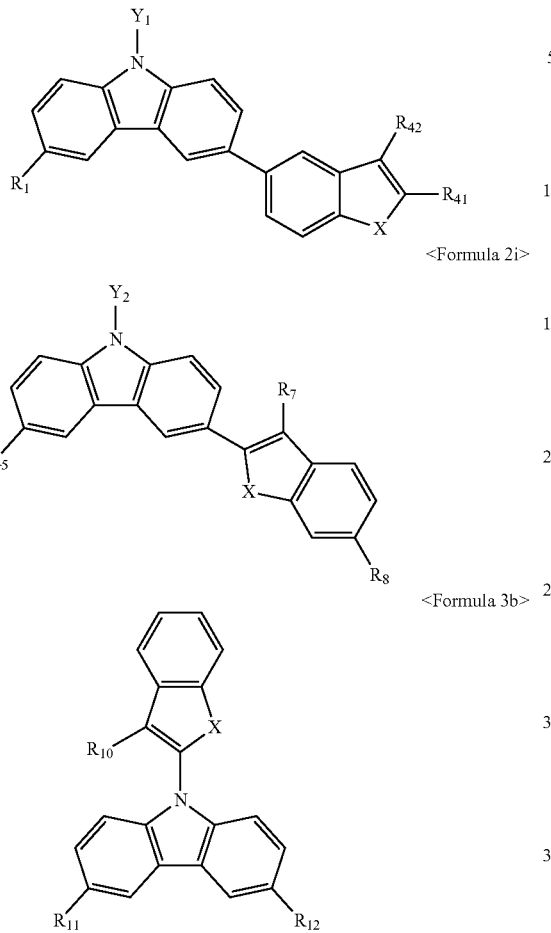

<Formula 1j>

<Formula 2i>

<Formula 3b>

In Formulae 1i, 1j, 2i, and 3b, X may be an oxygen atom or a sulfur atom.

$Y_1$ and $Y_2$ may be each independently selected from:

i) a phenyl group, a 1-naphthyl group, a 2-naphthyl group, a 1-fluorenyl group, a 2-fluorenyl group, a 3-fluorenyl group, and a 4-fluorenyl group; and ii) a phenyl group, a 1-naphthyl group, a 2-naphthyl group, a 1-fluorenyl group, a 2-fluorenyl group, a 3-fluorenyl group, and a 4-fluorenyl group, each substituted with at least one of a deuterium, a methyl group, an ethyl group, a phenyl group, 1-naphthyl group and 2-naphthyl group.

$R_1$, $R_5$, $R_7$, $R_8$, $R_{10}$, $R_{11}$, $R_{12}$, $R_{41}$ and $R_{42}$ may be each independently selected from:

i) a hydrogen atom, a deuterium atom, —F, a cyano group, a nitro group, a methyl group, an ethyl group, a phenyl group, a naphthyl group, a fluorenyl group, a carbazolyl group and —N($Q_1$)($Q_2$), in which $Q_1$ and $Q_2$ may be each independently selected from a phenyl group and a naphthyl group; and ii) a phenyl group, a naphthyl group, a fluorenyl group and a carbazolyl group, each substituted with at least one of a deuterium, —F, a cyano group, a nitro group, a methyl group, an ethyl group, a phenyl group, a naphthyl group, and an anthryl group.

In another embodiment, the carbazole-based compound may be represented by one of the following Formulae 1i, 1j, 2i, and 3b, but it is not limited thereto.

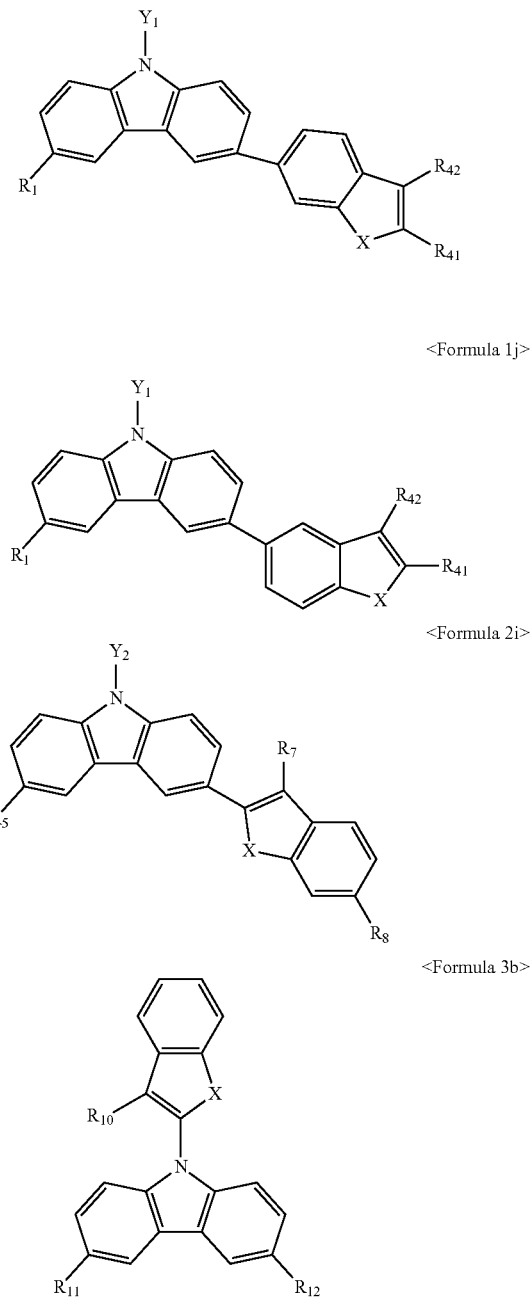

<Formula 1i>

<Formula 1j>

<Formula 2i>

<Formula 3b>

In Formulae 1i, 1j, 2i, and 3b, X may be an oxygen atom or a sulfur atom.

$Y_1$ and $Y_2$ may be each independently represented by one of the following Formulae 4-1 to 4-4.

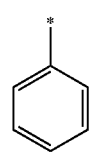

4-1

4-2
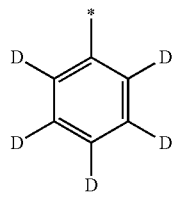
4-3
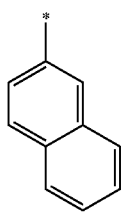
4-4
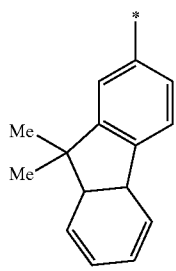
In Formulae 4-1 to 4-4, * may be a binding site to N of a carbazole ring.
$R_1$, $R_5$, $R_7$, $R_8$, $R_{10}$, $R_{11}$, $R_{12}$, $R_{41}$, and $R_{42}$ may be each independently represented by one of the following Formulae 5-1 to 5-8.
5-1
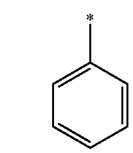
5-2
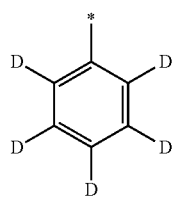
5-3
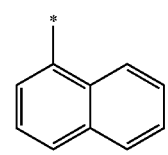
5-4
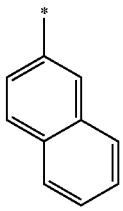
5-5
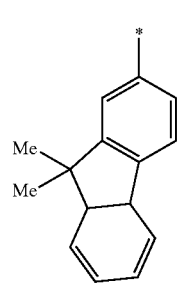
5-6
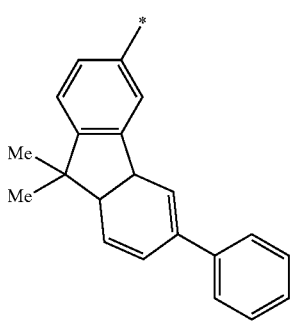
5-7
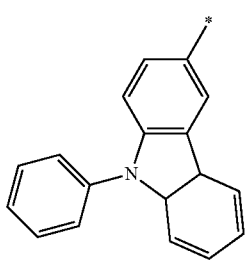
5-8
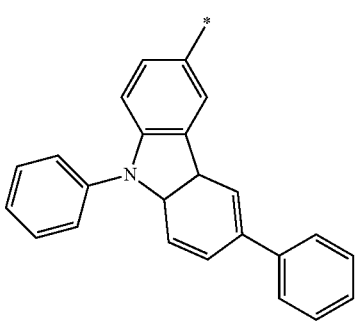
In Formulae 5-1 to 5-8, * is a binding site.
The carbazole-based compound may be one of the following Compounds 1 to 9, but it is not limited thereto.

[Compound 1]
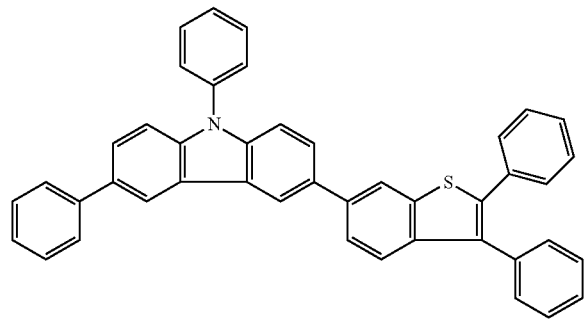
[Compound 2]
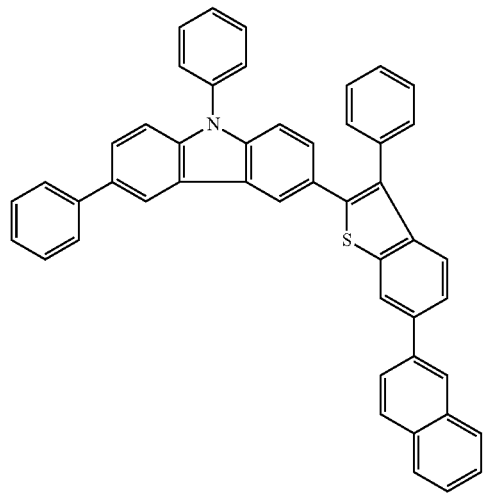
[Compound 3]
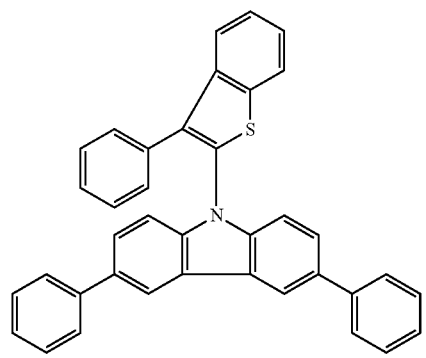
[Compound 4]
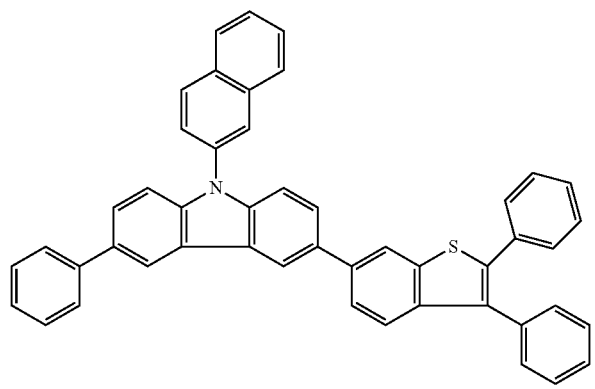
[Compound 5]
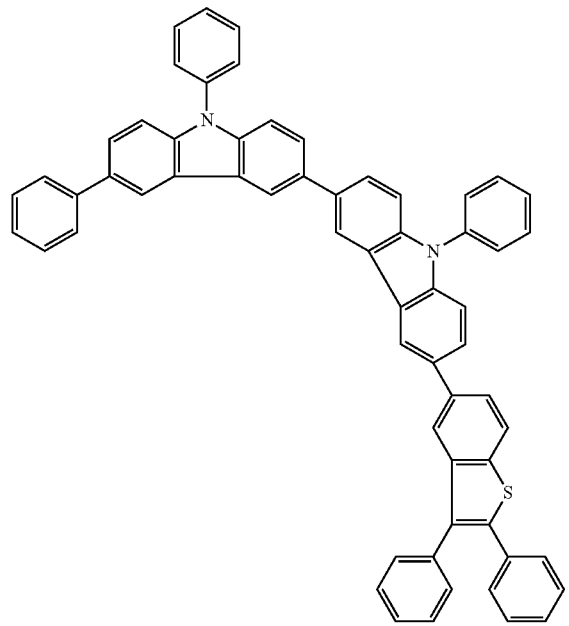

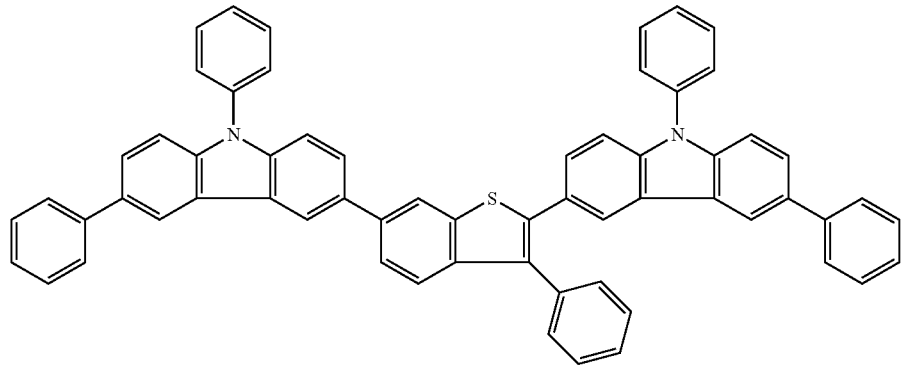

[Compound 6]

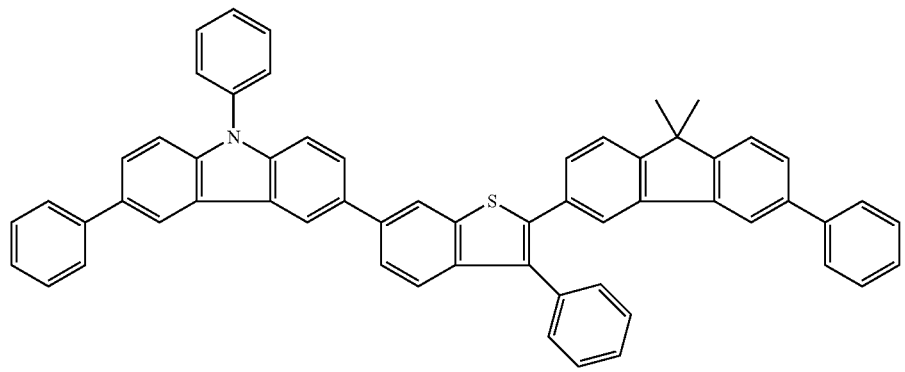

[Compound 7]

[Compound 8]

[Compound 9]

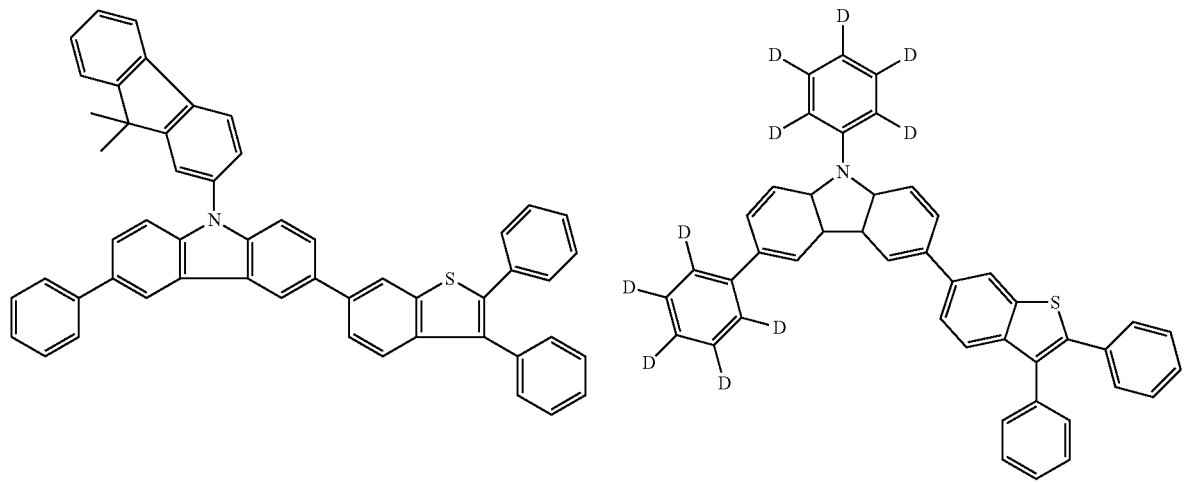

The carbazole-based compound represented by one of Formulae 1 to 3 may have high electrical stability. Also, the carbazole-based compound may have a high lowest unoccupied molecular orbital (LUMO) level, and electrons may be prevented from being injected from an emission layer to a hole transport layer. Accordingly, an organic light-emitting device using the carbazole-based compound in an electron blocking layer may have improved lifespan.

Also, an organic light-emitting device including the carbazole-based compound represented by any one of Formulae 1 to 3 in the electron blocking layer may have improved efficiency.

The carbazole-based compound of Formula 1 or a carbazole-based compound represented by one of Formulae 1 to 3 may be synthesized by a suitable organic synthesis method.

At least one carbazole-based compound of Formula 1 or one of Formulae 1 to 3 may be included between a pair of electrodes in an organic light-emitting device. In an implementation, at least one silicon-based compound may be used in the emission layer.

Accordingly, an embodiment may provide an organic light-emitting device including a substrate; a first electrode; a second electrode; and an organic layer between the first electrode and the second electrode and including an emission layer. The organic layer may include at least one carbazole-based compound represented by Formula 1 or a carbazole-based compound represented by one of Formulae 1 to 3.

For example, the organic layer may include a hole-transporting region. The hole-transporting region may be between the first electrode and the emission layer EML. The hole-transporting region may include at least one of hole injection layer HIL, a hole transport layer HTL, a functional layer having both hole injecting and hole transporting capabilities (hereinafter, referred to as an "H-functional layer"), a buffer layer, and an electron blocking layer EBL. The organic layer may include an electron transport region between the EML and the second electrode. The electron transport region may include at least one of an electron transport layer and an electron injection layer, but it is not limited thereto.

In another embodiment, the organic layer may include an electron blocking layer between the first electrode and the emission layer. In an implementation, the carbazole-based compound according to an embodiment may be included in the electron blocking layer, but it is not limited thereto.

As used herein, the expression "(organic layer) includes at least one carbazole-based compound" may be construed as "(organic layer) may include one carbazole-based compound belonging to a range of Formula 1 or a carbazole-based compound represented by one of Formulae 1 to 3 or two or more different carbazole-based compound belonging to the range of Formula 1 or Formulae 1 to 3".

For example, the organic layer may include a carbazole-based compound and may only include Compound 1. In this regard, Compound 1 may exist in an emission layer (EML) of an organic light-emitting device. In another embodiment, the organic layer may include the carbazole-based compound and may include both Compound 1 and Compound 2. In this regard, Compound 1 and Compound 2 may exist in the same layer (for example, in the EML) or in different layers (for example, in a first EML and a second EML, respectively).

As used herein, the "organic layer" may refer to a single layer and/or a plurality of layers disposed between the first electrode and the second electrode of an organic light-emitting device.

The FIGURE illustrates an organic light-emitting device 10 according to an embodiment.

Hereinafter, a structure and a method of manufacturing an organic light-emitting device according to an embodiment will be described with reference to the FIGURE.

The substrate 11, which may be a suitable substrate for an organic light-emitting device, may include a glass substrate or a transparent plastic substrate with excellent mechanical strength, thermal stability, transparency, surface smoothness, ease of handling, and water resistance.

The first electrode 13 may be formed by, e.g., depositing or sputtering a material for a first electrode on the substrate 11. When the first electrode 13 is an anode, the material for the first electrode 13 may be selected from materials with a high work function to facilitate easier hole injection. The first electrode 13 may be a reflective electrode or a transmission electrode. The material for the first electrode 13 may be a transparent material with high conductivity, and examples of such a material may include indium tin oxide (ITO), indium zinc oxide (IZO), tin oxide ($SnO_2$), and zinc oxide (ZnO). When magnesium (Mg), aluminum (Al), aluminum-lithium (Al—Li), calcium (Ca), magnesium-indium (Mg—In), magnesium-silver (Mg—Ag), or the like is used, the first electrode 13 may be used as a reflective electrode.

The first electrode 13 may have a single-layer structure or a multi-layer structure including at least two layers. In an implementation, the first electrode 13 may have a three-layered structure of ITO/Ag/ITO, but is not limited thereto.

The organic layer 15 may be on the first electrode 13.

The organic layer 15 may include, e.g., an HIL, an HTL, an H-functional layer, a buffer layer, an EBL, an EML, an ETL, and/or an EIL.

The HIL may be formed on the first electrode 13 by using various methods, e.g., vacuum deposition, spin coating, casting, and Langmuir-Blodgett (LB) deposition.

When the HIL is formed using vacuum deposition, vacuum deposition conditions may vary according to the compound that is used to form the HIL, and the desired structure and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 to about 100 Å/sec. However, the deposition conditions are not limited thereto.

When the HIL is formed using spin coating, the coating conditions may vary according to the compound that is used to form the HIL, and the desired structure and thermal properties of the HIL to be formed. For example, the coating rate may be in the range of about 2,000 rpm to about 5,000 rpm, and a temperature at which heat treatment is performed to remove a solvent after coating may be in the range of about 80° C. to about 200° C. However, the coating conditions are not limited thereto.

The HIL may further include a suitable hole injection material. Non-limiting examples of the suitable hole injection material may include N,N'-diphenyl-N,N'-bis-[4-(phenyl-m-tolyl-amino)-phenyl]-biphenyl-4,4'-diamine (DNTPD), a phthalocyanine compound such as copper phthalocyanine, 4,4',4"-tris(3-methylphenylphenylamino) triphenylamine (m-MTDATA), N,N'-di(1-naphthyl)-N,N'-diphenylbenzidine (NPB), TDATA, 2-TNATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (pani/CSA), or (polyaniline)/poly(4-styrenesulfonate) (PANI/PSS):

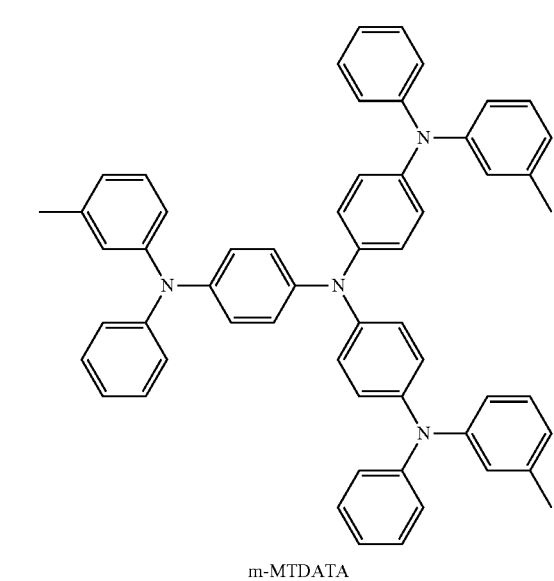

m-MTDATA

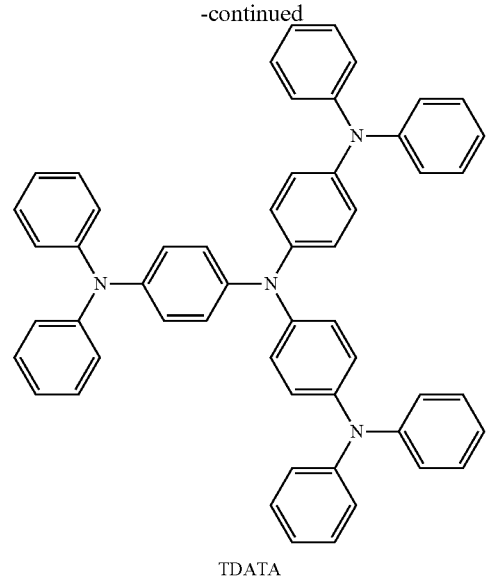

TDATA

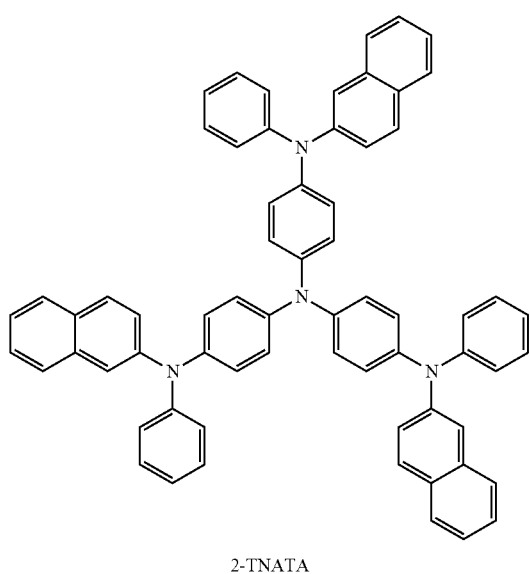 [SMILES: c1ccc(N(c2ccc(N(c3ccc(N(c4ccccc4)c4ccc5ccccc5c4)cc3)c3ccc(N(c4ccccc4)c4ccc5ccccc5c4)cc3)cc2)c2ccc3ccccc3c2)cc1]

2-TNATA

A thickness of the HIL may be about 100 Å to about 10,000 Å, e.g., about 100 Å to about 1,000 Å. When the thickness of the HIL is within the range described above, the HIL may have satisfactory hole injection characteristics without a substantial increase in a driving voltage.

Then, the HTL may be formed on the HIL by using, e.g., vacuum deposition, spin coating, casting, LB deposition, or the like. When the HTL is formed using vacuum deposition or spin coating, the deposition and coating conditions may be similar to those for the formation of the HIL, though the deposition and coating conditions may vary according to a compound that is used to form the HTL.

As a hole-transporting material, a suitable hole-transporting material may be used, e.g., a carbazole derivative, such as N-phenylcarbazole or polyvinylcarbazole, N,N'-bis(3-methylphenyl)-N,N'-diphenyl-[1,1-biphenyl]-4,4'-diamine (TPD), 4,4',4"-tris(N-carbazolyl)triphenylamine (TCTA), N,N'-di(1-naphthyl)-N,N'-diphenylbenzidine (NPB), or the like, but it is not limited thereto.

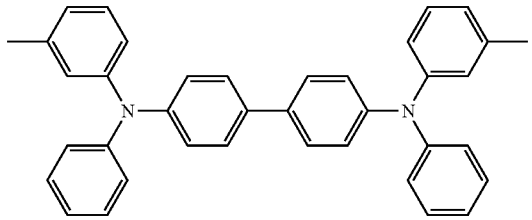

TPD

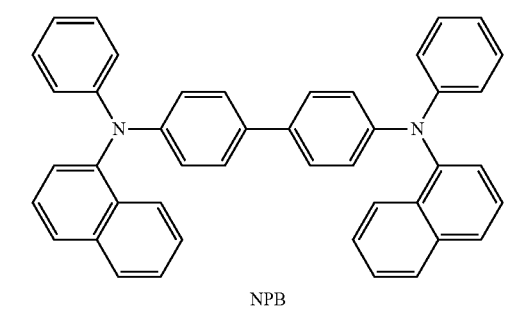

NPB

A thickness of the HTL may be in a range of about 50 Å to about 2,000 Å, e.g., about 100 Å to about 1,500 Å. When the thickness of the HTL is within the range described above, the HTL may have satisfactory hole transport characteristics without a substantial increase in a driving voltage.

The H-functional layer may include at least one of a hole injection layer material and a hole transport layer material. A thickness of the H-functional layer may be in a range of about 500 Å to about 10,000 Å, e.g., about 100 Å to about 1,000 Å. When the thickness of the H-functional layer is within the range described above, the H-functional layer may have satisfactory hole injection and transport characteristics without a substantial increase in a driving voltage.

At least one of the HIL, the HTL, and the H-functional layer may further include a charge-generating material in addition to the suitable hole injection layer material, a hole transport layer material, and a material having hole injection and/or hole transport capabilities to help improve conductivity of a film or the like.

The charge-generating material may include, e.g., one of quinine derivatives, metal oxides, and compounds with a cyano group, but the charge-generating material is not limited thereto. For example, non-limiting examples of the charge-generating material may include quinine derivatives, such as tetracyanoquinodimethane (TCNQ), and 2,3,5,6-tetrafluoro-tetracyano-1,4-benzoquinodimethane (F4-TCNQ); metal oxides such as tungsten oxides and molybdenym oxides; and cyano group-containing compounds, such as Compound 200 below, but the charge-generating material is not limited thereto.

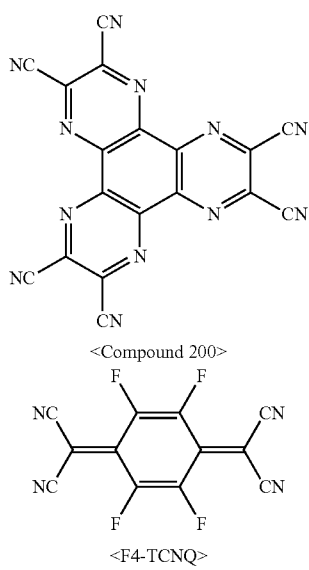

<Compound 200>

<F4-TCNQ>

When the HIL, the HTL, or the H-functional layer further includes the charge-generating material, the charge-generating material may be homogeneously or non-homogeneously dispersed in the HIL, the HTL, or the H-functional layer.

A buffer layer may be disposed between at least one of the HIL, the HTL, and the H-functional layer and the EML. The buffer layer may help compensate for an optical resonance distance of light according to a wavelength of the light emitted from the EML, and thus may help increase efficiency. The buffer layer may include a suitable hole injecting layer material or hole transporting layer material. In an implementation, the buffer layer may include the same material as one of the materials included in the HIL, the HTL, and the H-functional layer that underlie the buffer layer.

An EBL may be between the EML and at least one of the HIL, HTL, the H-functional layer, and the buffer layer. The EBL may block electron injection into the hole transport region and thus, may help improve the lifespan of an organic light-emitting device. The EBL may be formed by vacuum deposition, spin coating, casting, LB deposition, or the like. When the EBL is formed using vacuum deposition or spin coating, the deposition and coating conditions may be similar to those for the formation of the HIL, though the conditions for deposition and coating may vary according to the material that is used to form the EML.

The EBL may include the carbazole-based compound represented by one of Formulae 1 to 3 above, e.g., according to an embodiment.

A thickness of the EBL may be about 30 Å to about 1,000 Å, e.g., about 50 Å to about 300 Å. When the thickness of the EBL satisfies the range described above, the movement of the electrons as well as the movement of the holes may be prevented.

Then, the EML may be formed on the hole transport region by vacuum deposition, spin coating, casting, LB deposition, or the like. When the EML is formed using vacuum deposition or spin coating, the deposition and coating conditions may be similar to those for the formation of the HIL, though the conditions for deposition and coating may vary according to the material that is used to form the EML.

The EML may include a suitable emission material. For example, the EML may include a suitable host and a dopant. In an implementation, the EML may include the carbazole-based compound represented by any one of Formulae 1 to 3, e.g., according to an embodiment.

As the host, Alq3, 4,4'-N,N'-dicarbazol-biphenyl (CBP), poly(n-vinylcarbazole) (PVK), 9,10-di(naphthalen-2-yl)anthracene (ADN), TCTA, 1,3,5-tris(N-phenylbenzimidazole2-yl)benzene (TPBI), 3-tert-butyl-9,10-di(naphth-2-yl) anthracene (TBADN), mCP, OXD-7, or the like may be used, but the host is not limited thereto.

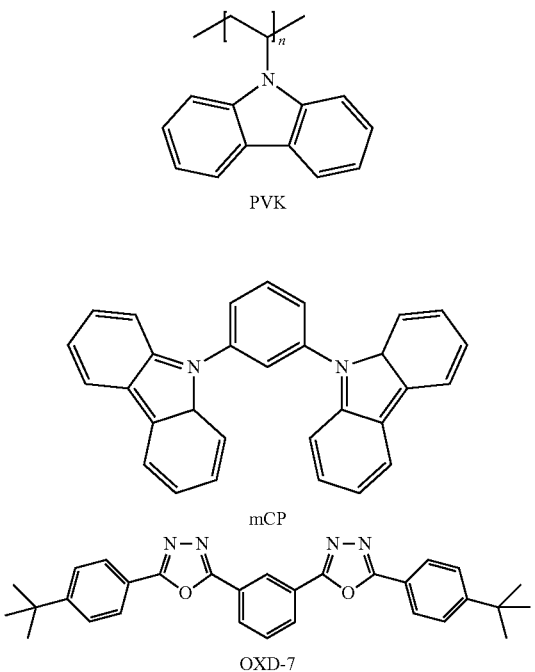

The dopant may include at least one of a fluorescent dopant and a phosphorescent dopant. The phosphorescent dopant may be an organic metal complex including iridium (Ir), platinum (Pt), osmium (Os), rhenium (Re), titanium (Ti), zirconium (Zr), hafnium (Hf), or a combination of two or more thereof.

Examples of a suitable blue dopant may include $F_2Ipic$, $(F_2ppy)_2Ir(tmd)$, $Ir(dfppz)_3$, ter-fluorene(fluorene), 4,4'-bis (4-diphenylaminostyryl)biphenyl (DPAVBi), 2,5,8,11-tetra-tert-butyl group perylene (TBPe), and DPVBi, but the blue dopant is not limited thereto.

35
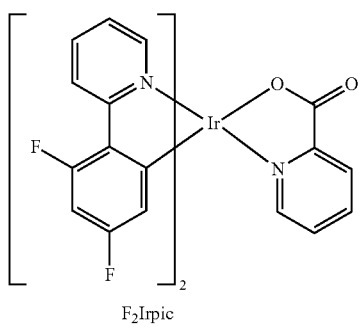
F₂Irpic
36
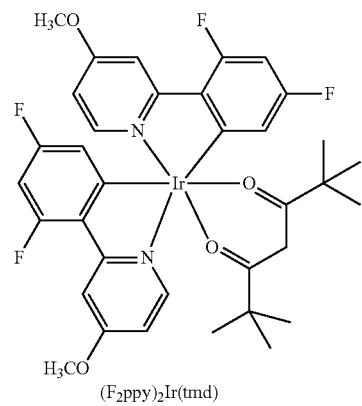
(F₂ppy)₂Ir(tmd)
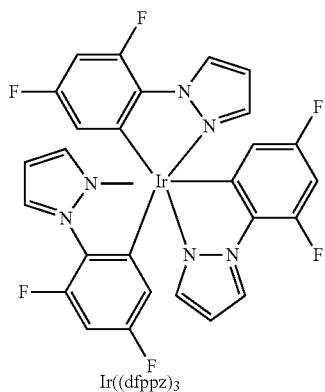
Ir((dfppz)₃)
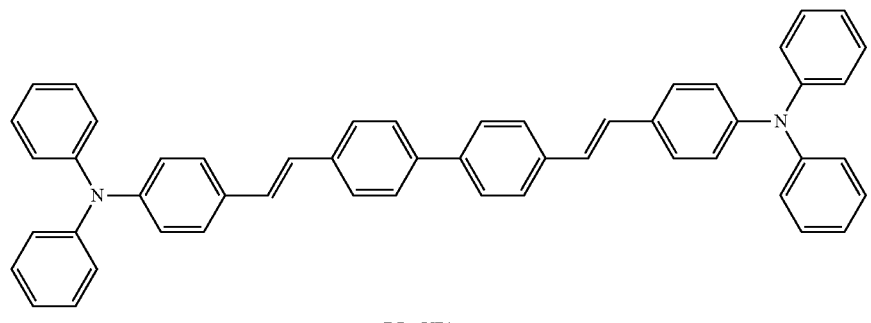
DPAVBi
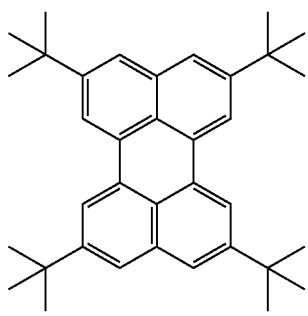
TBPe
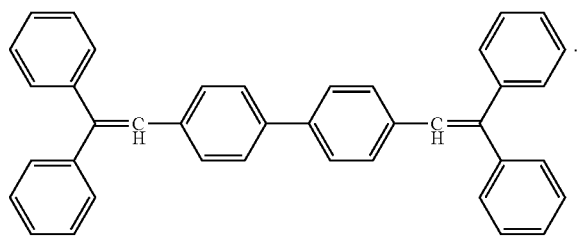
DPVBi Examples of a suitable red dopant may include PtOEP, Ir(piq)₃, and BtpIr, but the red dopant is not limited thereto.

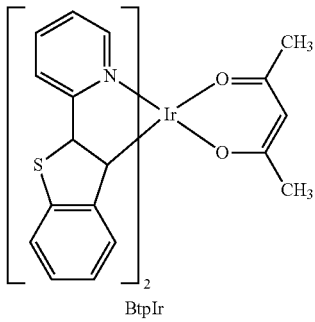
BtpIr

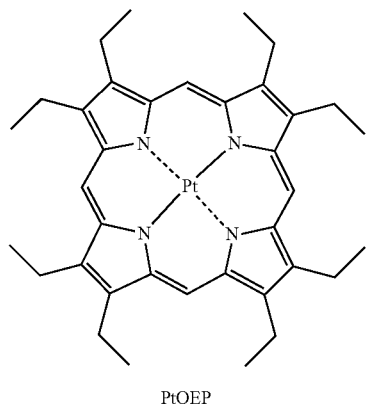
PtOEP

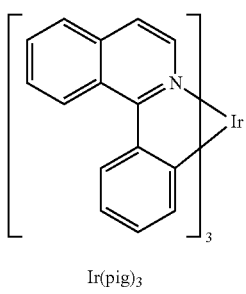
Ir(piq)₃

Examples of a suitable green dopant may include Ir(ppy)₃ (ppy=phenylpyridine), Ir(ppy)₂(acac), and Ir(mpyp)₃, but the green dopant is not limited thereto.

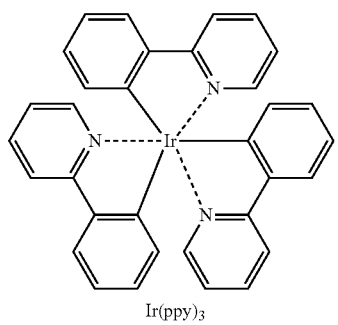
Ir(ppy)₃

-continued

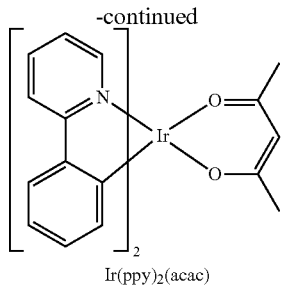
Ir(ppy)₂(acac)

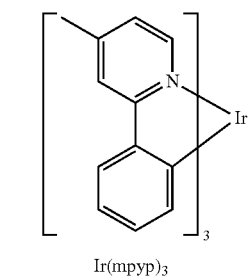
Ir(mpyp)₃

When the EML includes the host and the dopant, an amount of the dopant may generally be about 0.01 wt % to about 15 wt %, based on 100 wt % of the EML, but it is not limited thereto.

A thickness of the EML may be about 200 Å to about 700 Å. When the thickness of the EML is in the range described above, the EML may have an excellent light emitting ability without a substantial increase in driving voltage.

Then, the ETL may be formed on the EML by various methods such as vacuum deposition, spin coating, or casting. When the ETL is formed by vacuum deposition or spin coating, the deposition and coating conditions may be similar to those for forming the HIL, though the deposition and coating conditions may vary according to a compound that is used to form the ETL. An electron-transporting material may include a suitable electron-transporting material that stably transports electrons injected from an electron injection electrode (cathode). Non-limiting examples of the electron-transporting material may include quinoline derivatives, such as tris(8-quinolinorate)aluminum (Alq3), TAZ, BAlq, beryllium bis(benzoquinolin-10-olate) (Bebq2), 9,10-di(naphthalene-2-yl)anthracene (ADN), Compound 101, Compound 102, and Bphen, but they are not limited thereto.

<Compound 101>

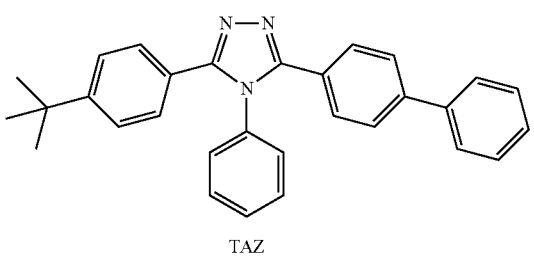
TAZ

-continued

<Compound 102>

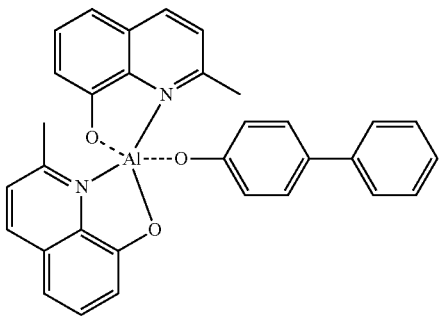

BAlq

<Compound 103>

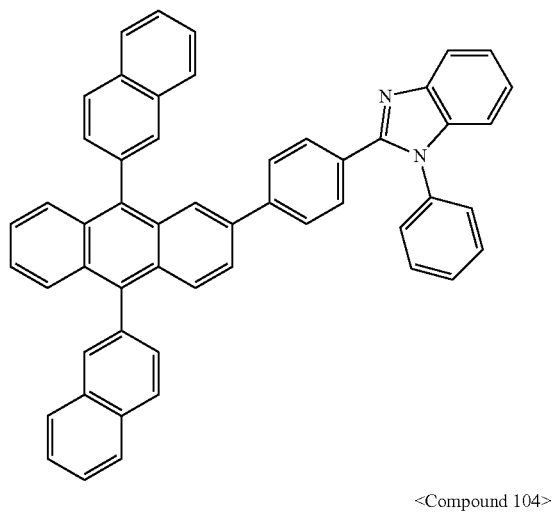

<Compound 104>

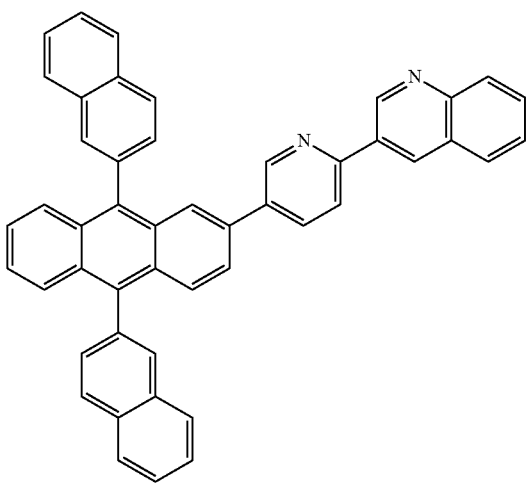

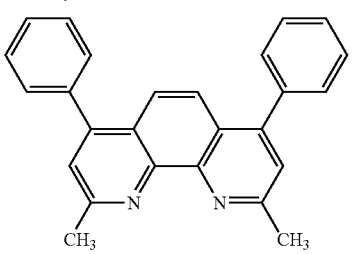

BCP

-continued

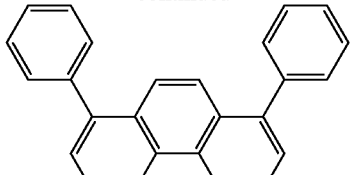

Bphen

A thickness of the ETL may be from about 100 Å to about 1,000 Å, e.g., about 150 Å to about 500 Å. When the thickness of the ETL is within these ranges, the ETL may have a satisfactory electron transporting ability without a substantial increase in driving voltage.

In an implementation, the ETL may further include a metal-containing material in addition to a suitable electron-transporting organic compound. The metal-containing material may include a Li complex. Non-limiting examples of the Li complex may include lithium quinolate (LiQ) and Compound 203 below:

<Compound 203>

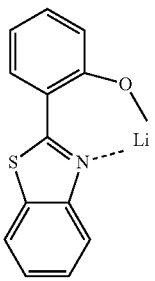

Then, the EIL, which may facilitate the injection of electrons from the cathode, may be formed on the ETL. A suitable electron-injecting material may be used to form the EIL.

Non-limiting examples of the materials for forming the EIL may include an EIL material such as LiF, NaCl, CsF, $Li_2O$, and BaO. The deposition conditions for forming the EIL may be similar to those for the formation of the HIL, though the deposition conditions may vary according to the compound that is used to form the EIL.

A thickness of the EIL may be about 1 Å to about 100 Å, e.g., about 3 Å to about 90 Å. When the thickness of the EIL is within these ranges, the EIL may have a satisfactory electron injection ability without a substantial increase in driving voltage.

The second electrode 17 may be disposed on the organic layer 15. The second electrode 17 may be a cathode that is an electron injection electrode, wherein a material for forming the second electrode 17 may be a metal, an alloy, and an electro-conductive compound, which have a low work function, or a mixture thereof. In this regard, the second electrode 17 may be formed of lithium (Li), magnesium (Mg), aluminum (Al), aluminum lithium (Al—Li), calcium (Ca), magnesium-indium (Mg—In), magnesium-silver (Mg—Ag), or the like, which may be formed as a thin film type transmission electrode. In some embodiments, to manufacture a top-emission light-emitting device, the transmission electrode may be formed of ITO or IZO.

When a phosphorescent dopant is used in the EML, the HBL may be formed between the ETL and the EML by using vacuum deposition, spin coating, casting, LB deposition, or the like, in order to help prevent diffusion of triplet excitons or holes into the ETL. When the HBL is formed by using vacuum deposition or spin coating, the conditions for deposition and coating may be similar to those for the formation of the HIL, although the conditions for deposition and coating may vary according to the compound that is used to form the HBL. A suitable hole-blocking material may be used, and non-limiting examples of the hole-blocking material may include oxadiazole derivatives, triazole derivatives, phenanthroline derivatives, or the like. In an implementation, BCP shown below may be used as a hole-blocking material.

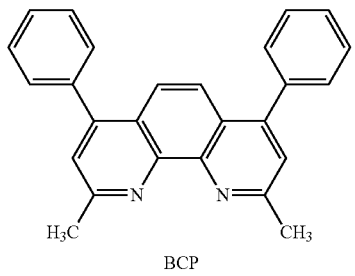

BCP

A thickness of the HBL may be from about 20 Å to about 1,000 Å, e.g., about 30 Å to about 300 Å. When the thickness of the HBL is within these ranges, the HBL may have an improved hole blocking ability without a substantial increase in driving voltage.

Although the organic light-emitting device 10 of the FIGURE is described above, the embodiments are not limited thereto.

The unsubstituted $C_1$-$C_{60}$ alkyl group (or a $C_1$-$C_{60}$ alkyl group) used herein may be a linear or branched $C_1$-$C_{60}$ alkyl group, such as methyl, ethyl, propyl, isobutyl, sec-butyl, pentyl, iso-amyl, or hexyl, wherein the substituted $C_1$-$C_{60}$ alkyl group may refer to the unsubstituted $C_1$-$C_{60}$ alkyl group in which at least one hydrogen atom is substituted with a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, a halogen atom, a hydroxyl group, a cyano group, a nitro group, an amino group, an amidino group, a hydrazine group, a hydrazone group, a carboxyl group or a salt thereof, a sulfonic acid or a salt thereof, and phosphoric acid or a salt thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_1$-$C_{60}$ heteroaryl group; a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_1$-$C_{60}$ heteroaryl group, each substituted with at least one of a deuterium, a halogen atom, a hydroxyl group, a cyano group, a nitro group, an amino group, an amidino group, a hydrazine group, a hydrazone group, a carboxyl group or a salt thereof, a sulfonic acid or a salt thereof, phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenyl fluorenyl group, a carbazolyl group, a phenyl a carbazolyl group, a pyridyl group, a pyrimidinyl group, a pyrazinyl group, a pyridazinyl group, a triazinyl group, a quinolyl group, and an isoquinolyl group; and —N($Q_{11}$)($Q_{12}$); and —Si($Q_{13}$)($Q_{14}$)($Q_{15}$) (wherein, $Q_{11}$ and $Q_{12}$ may be each independently, a $C_6$-$C_{60}$ aryl group, or a $C_1$-$C_{60}$ heteroaryl group and $Q_{13}$ to $Q_{15}$ may be each independently, a $C_1$-$C_{60}$ alkyl group, a $C_1$-$C_{60}$ alkoxy group, a $C_6$-$C_{60}$ aryl group, or a $C_1$-$C_{60}$ heteroaryl group).

The unsubstituted $C_1$-$C_{60}$ alkoxy group (or $C_1$-$C_{60}$ alkoxy group) used herein has a formula of —OA (where A is the unsubstituted $C_1$-$C_{60}$ alkyl group described above), and detailed examples thereof are a methoxy group, an ethoxy group, an isopropyloxy group, and at least one hydrogen atom of these alkoxy groups may be substituted with the same substituent as described above in connection with the substituted $C_1$-$C_{60}$ alkyl group.

The unsubstituted $C_2$-$C_{60}$ alkenyl group (or $C_2$-$C_{60}$ alkenyl group) used herein refers to an unsubstituted $C_2$-$C_{60}$ alkyl group having one or more carbon-carbon double bonds at a center or end thereof. Examples of the unsubstituted $C_2$-$C_{60}$ alkenyl group are an ethenyl group, a propenyl group, and a butenyl group. At least one hydrogen atom of these unsubstituted $C_2$-$C_{60}$ alkenyl groups may be substituted with the same substituent as described above in connection with the substituted $C_1$-$C_{60}$ alkyl group.

The unsubstituted $C_2$-$C_{60}$ alkynyl group (or $C_2$-$C_{60}$ alkynyl group) used herein refers to an unsubstituted $C_2$-$C_{60}$ alkyl group having one or more carbon-carbon triple bonds at a center or end thereof. Examples of the unsubstituted $C_2$-$C_{60}$ alkynyl group are ethynyl, propynyl, and the like. At least one hydrogen atom of these alkynyl groups may be substituted with the same substituent as described above in connection with the substituted $C_1$-$C_{60}$ alkyl group.

The unsubstituted $C_3$-$C_{60}$ cycloaryl group is a monovalent saturated cyclic hydrocarbon group having 3 to 60 carbon atoms, and detailed examples thereof include a cyclopropyl, a cyclobutyl, a cyclopentyl, a cyclohexyl, a cyclooctyl, or the like. At least one hydrogen atom of the unsubstituted $C_3$-$C_{60}$ cycloaryl group may be substituted with the same substituent as described above in connection with the substituted $C_1$-$C_{60}$ alkyl group.

The unsubstituted $C_3$-$C_{60}$ cycloalkenyl group refers to a ring-type unsaturated hydrocarbon group that has at least one carbon-carbon double bond, but that is not an aromatic ring, wherein examples thereof include a cyclopropenyl, a cyclobutenyl, a cyclopentenyl, a cyclohexenyl, a cycloheptenyl, a 1,3-cyclohexadienyl group, a 1,4-cyclohexadienyl group, a 2,4-cycloheptadienyl group, and a 1,5-cyclooctadienyl group. At least one hydrogen atom of the cycloalkenyl group may be substituted with the same substituent as described above in connection with the substituted $C_1$-$C_{60}$ alkyl group.

The unsubstituted $C_6$-$C_{60}$ aryl group is a monovalent group having a carbocyclic aromatic system having 6 to 60 carbon atoms including at least one aromatic ring. The unsubstituted $C_6$-$C_{60}$ arylene group is a divalent group having a carbocyclic aromatic system having 6 to 60 carbon atoms including at least one aromatic ring. When the aryl group and the arylene group include two or more rings, the rings may be fused to each other. At least one hydrogen atom of these aryl groups and arylene groups may be substituted with the same substituent as described above in connection with the substituted $C_1$-$C_{60}$ alkyl group.

Examples of the substituted or unsubstituted $C_6$-$C_{60}$ aryl group are a phenyl group, a $C_1$-$C_{10}$ alkylphenyl group (for example, ethylphenyl group), a $C_1$-$C_{10}$ alkylbiphenyl group (for example, ethylbiphenyl group), a halophenyl group (for example, an o-, m- or p-fluorophenyl group, a dichlorophenyl group), a dicyanophenyl group, a trifluoromethoxyphenyl group, o-, m-, and p-tolyl groups, o-, m- and p-cumenyl groups, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, a halonaphthyl group (for example, a fluoronaphthyl group), a $C_1$-$C_{10}$ alkylnaphthyl group (for example, a methylnaphthyl group), a $C_1$-$C_{10}$ alkoxynaphthyl group (for example, a methoxynaphthyl group), an anthracenyl group, a azulenyl group, a heptalenyl group, an acenaphthylenyl group, a phenalenyl group, a fluorenyl group, an anthraquinolinyl group, a methylanthryl group, a phenanthryl group, a triphenylenyl group, a pyrenyl group, a chrysenyl group, an ethyl-chrysenyl group, a picenyl group, a perylenyl group, a chloroperylenyl group, a pentaphenyl group, a pentasenyl group, a tetraphenylenyl group, a hexaphenyl group, a hexacenyl group, a rubicenyl group, a coroneryl group, a trinaphthylenyl group, a heptaphenyl group, a heptacenyl group, a pyranthrenyl group, and an ovalenyl group, and examples of the substituted $C_6$-$C_{60}$ aryl group may be easily understood by referring to the examples of the unsubstituted $C_6$-$C_{60}$ aryl group and the substituents of the substituted $C_1$-$C_{60}$ alkyl group. Examples of the substituted or unsubstituted $C_6$-$C_{60}$ arylene group may be easily understood by referring to examples of the substituted or unsubstituted $C_6$-$C_{60}$ aryl group.

The unsubstituted $C_1$-$C_{60}$ heteroaryl group used herein refers to a monovalent group having a system composed of one or more aromatic rings having at least one heteroatom selected from nitrogen (N), oxygen (O), phosphorous (P), and sulfur (S) and carbon atoms as the remaining ring atoms. The unsubstituted $C_2$-$C_{60}$ heteroarylene group used herein refers to a divalent group having a system composed of one or more aromatic rings having at least one heteroatom selected from nitrogen (N), oxygen (O), phosphorous (P), and sulfur (S) and carbon atoms as the remaining ring atoms. In this regard, when the unsubstituted $C_2$-$C_{60}$ heteroaryl group and the unsubstituted $C_2$-$C_{60}$ heteroarylene group each include two or more rings, the rings may be fused to each other. At least one hydrogen atom of the unsubstituted $C_2$-$C_{60}$ heteroaryl group and the unsubstituted $C_2$-$C_{60}$ heteroarylene group may be substituted with the same substituent described in connection with the $C_1$-$C_{60}$ alkyl group.

Examples of the unsubstituted $C_2$-$C_{60}$ heteroaryl group are a pyrazolyl group, an imidazolyl group, an oxazolyl group, a thiazolyl group, a triazolyl group, a tetrazolyl, an oxadiazolyl group, a pyridinyl group, a pyridazinyl group, a pyrimidinyl group, a triazinyl group, a carbazolyl group, an indolyl group, a quinolinyl group, an isoquinolinyl group, a benzimidazolyl group, an imidazopyridinyl group, and an imidazopyrimidinyl group. Examples of the unsubstituted $C_2$-$C_{60}$ heteroarylene group may be easily understood by referring to the examples of the substituted or unsubstituted $C_2$-$C_{60}$ arylene group.

The substituted or unsubstituted $C_6$-$C_{60}$ aryloxy group indicates —$OA_2$ (where $A_2$ is the substituted or unsubstituted $C_6$-$C_{60}$ aryl group), and the substituted or unsubstituted $C_5$-$C_{60}$ arylthio group indicates —$SA_3$ (where $A_3$ is the substituted or unsubstituted $C_6$-$C_{60}$ aryl group).

Hereinafter, an organic light-emitting diode (OLED) according to an embodiment is described in detail with reference to Examples. However, the OLED according to an embodiment is not limited to the Examples.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Example 1

An anode was prepared by cutting a Corning 15 Ωcm² (1,200 Å) ITO glass substrate to a size of 50 mm×50 mm×0.7 mm, ultrasonically cleaning the glass substrate by using isopropyl alcohol and pure water for 5 minutes each, and then irradiating UV light thereon for 30 minutes and exposing the anode to ozone to clean it. Then, the anode was loaded into a vacuum deposition apparatus.

2-TNATA was deposited on the ITO glass substrate to form an HIL having a thickness of 600 Å, and then, NPB was deposited on the HIL to form an HTL having a thickness of 300 Å.

Compound 1 was deposited on the HTL to form an EBL having a thickness of 100 Å.

Then, TBPe and DPAVBi were co-deposited on the EBL at a weight ratio of 95:5 to form an EML having a thickness of 300 Å.

Then, Compound 103 was vacuum deposited on the EML to form an ETL having a thickness of 300 Å, LiF was vacuum deposited on the ETL to form an EIL having a thickness of 10 Å, and Al was vacuum deposited on the EIL to form a second electrode (cathode) having a thickness of 3,000 Å to manufacture an organic light-emitting device.

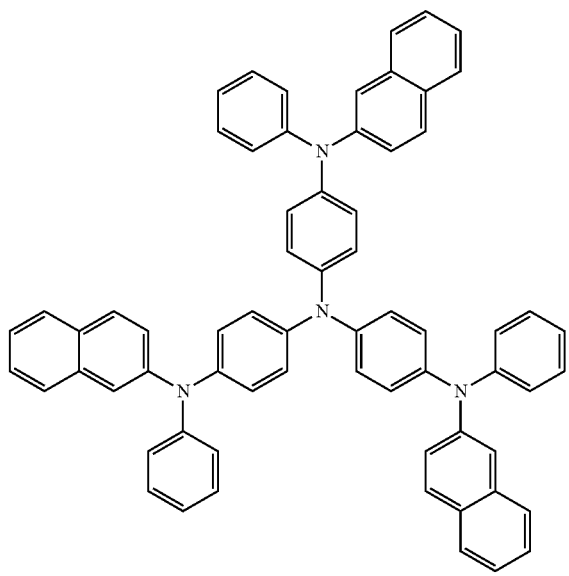
2-TNATA
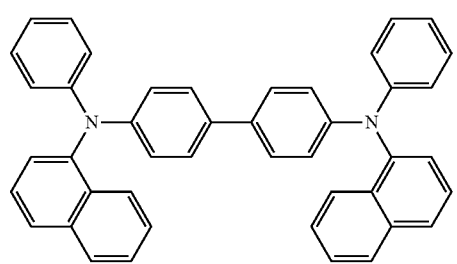
NPB
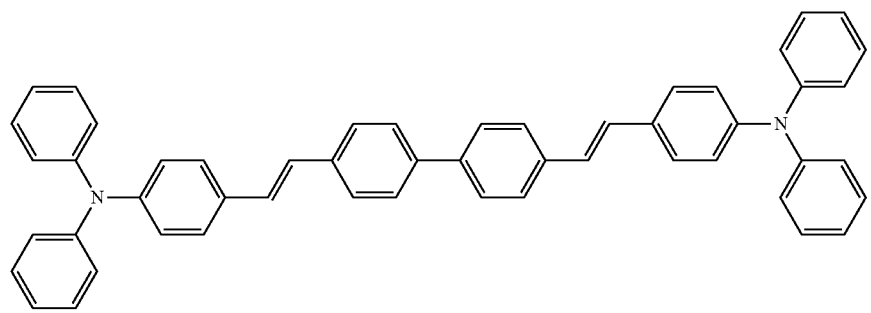
DPAVBi
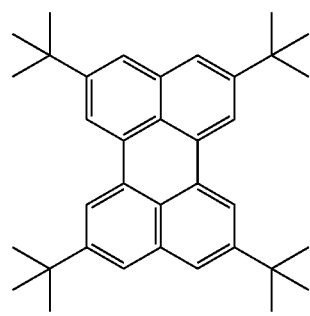
TBPe

<Compound 103>

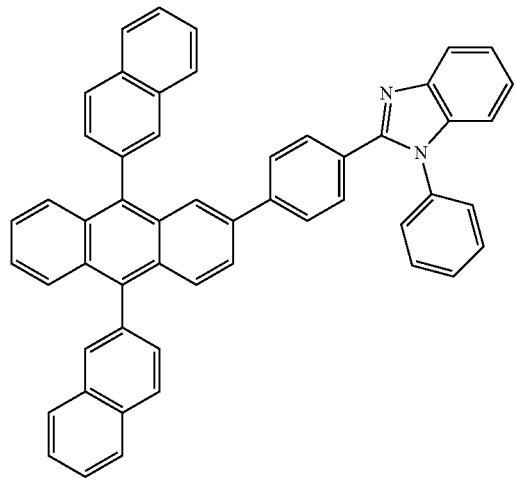

Example 2

An organic light-emitting device was manufactured in the same manner as in Example 1, except that Compound 2 was used instead of Compound 1 when forming an EBL.

Example 3

An organic light-emitting device was manufactured in the same manner as in Example 1, except that Compound 6 was used instead of Compound 1 when forming an EBL.

Example 4

An organic light-emitting device was manufactured in the same manner as in Example 1, except that Compound 8 was used instead of Compound 1 when forming an EBL.

Comparative Example 1

An organic light-emitting device was manufactured in the same manner as in Example 1, except that an EBL was not formed.

Evaluation Example 1

Driving voltages, brightness, efficiencies, and lifespans of the organic light-emitting devices of Examples 1 to 4 and Comparative Example 1 were evaluated by using a PR650 Spectroscan source measurement unit (a product of Photo-Research). The results obtained therefrom are as shown in Table 1.

TABLE 1

| | Electron blocking layer material | Driving voltage (V) | Current density (mA/cm$^2$) | Efficiency (cd/A) | Comparative lifespan |
|---|---|---|---|---|---|
| Comparative Example 1 | — | 5.62 | 10 | 16.7 | 1 |
| Example 1 | Compound 1 | 5.25 | 10 | 18.9 | 1.35 |
| Example 2 | Compound 2 | 5.02 | 10 | 19.0 | 1.1 |
| Example 3 | Compound 6 | 4.95 | 10 | 21.2 | 1.53 |
| Example 4 | Compound 8 | 4.87 | 10 | 20.1 | 1.32 |

As may be seen in Table 1, above, the organic light-emitting devices in Examples 1 to 4 showed efficiencies and lifespans that are at least 10% improved or higher than those of the organic light-emitting device in Comparative Example 1.

As described above, according to the one or more of the above embodiments, the carbazole-based compound may have excellent electrical properties, excellent optical properties, high charge transport capability, and high thermal stability, in which an organic light-emitting device including the carbazole-based compound may show high efficiency, low voltage, high brightness, and a long lifespan.

The embodiments may provide a high quality organic light-emitting device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting device, comprising:
   a first electrode;
   a second electrode;
   an organic layer between the first electrode and the second electrode, the organic layer including an emission layer; and
   an electron blocking layer between the first electrode and the emission layer, the electron blocking layer including a carbazole-based compound represented by one of the following Formulae 1 to 3:

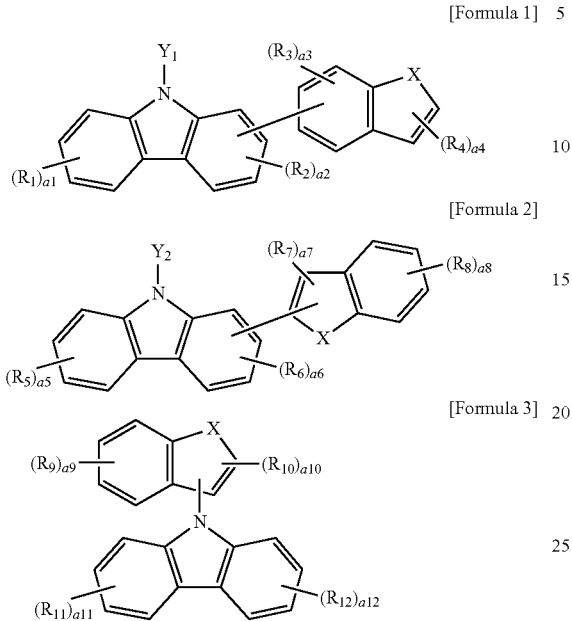

[Formula 1]

[Formula 2]

[Formula 3]

wherein, in Formulae 1 to 3,

X is an oxygen atom or a sulfur atom;

$Y_1$ and $Y_2$ are each independently selected from a hydrogen atom, a deuterium atom, a substituted or unsubstituted $C_1$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{30}$ aryl group, and a substituted or unsubstituted $C_2$-$C_{30}$ heteroaryl group;

$R_1$, $R_2$, $R_5$, $R_6$, $R_{11}$, and $R_{12}$ are each independently selected from a hydrogen atom, a deuterium atom, a halogen atom, a cyano group, a nitro group, a hydroxy group, a carboxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{60}$ cycloalkyl group, a substituted or unsubstituted $C_3$-$C_{60}$ cycloalkylene group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arythio group, a substituted or unsubstituted $C_2$-$C_{60}$ heteroaryl group, and —N($Q_1$)($Q_2$), $R_3$, $R_4$, $R_7$, $R_8$, $R_9$, and $R_{10}$ are each independently selected from:

a hydrogen atom, a deuterium atom, a halogen atom, a cyano group, a nitro group, a hydroxy group, $C_1$-$C_{20}$ alkyl group, a cyclopropyl group, a cyclobutyl group, a cyclopentyl group, a cyclohexyl group, a cycloheptyl group, a cyclooctyl group, a cyclopentenyl group, a cyclopentadienyl group, a cyclohexenyl group, a cyclohexadienyl group, a cycloheptadienyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridyl group, a pyrazinyl group, a pyrimidinyl group, a pyridazinyl group, an isoindolyl group, an indolyl group, an indazolyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a furanyl group, a benzofuranyl group, a thiophenyl group, a thiazolyl group, an isothiazolyl group, a benzothiazolyl group, an isooxazolyl group, an oxazolyl group, a triazolyl group, a tetrazolyl group, an oxadiazolyl group, a triazinyl group, a benzooxazolyl group, a dibenzofuranyl group, a dibenzothiophenyl group, and —N($Q_1$)($Q_2$); and a $C_1$-$C_{20}$ alkyl group, a cyclopropyl group, a cyclobutyl group, a cyclopentyl group, a cyclohexyl group, a cycloheptyl group, a cyclooctyl group, a cyclopentenyl group, a cyclopentadienyl group, a cyclohexenyl group, a cyclohexadienyl group, a cycloheptadienyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridyl group, a pyrazinyl group, a pyrimidinyl group, a pyridazinyl group, an isoindolyl group, an indolyl group, an indazolyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a furanyl group, a benzofuranyl group, a thiophenyl group, a thiazolyl group, an isothiazolyl group, a benzothiazolyl group, an isooxazolyl group, an oxazolyl group, a triazolyl group, a tetrazolyl group, an oxadiazolyl group, a triazinyl group, a benzooxazolyl group, a dibenzofuranyl group, and a dibenzothiophenyl group, each substituted with at least one of a deuterium, a halogen atom, a hydroxyl group, a cyano group, a nitro group, a $C_1$-$C_{20}$ alkyl group, a $C_1$-$C_{20}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{30}$ aryl group, a $C_6$-$C_{30}$ aryloxy group, a $C_6$-$C_{30}$ arylthio group, and a $C_1$-$C_{30}$ heteroaryl group, $Q_1$ and $Q_2$ are each independently selected from a hydrogen atom, a deuterium atom, a $C_1$-$C_{10}$ alkyl group, a $C_6$-$C_{30}$ aryl group, and a $C_2$-$C_{30}$ heteroaryl group; or $Q_1$ and $Q_2$ bind to each other to form a saturated ring or an unsaturated ring formed of nitrogen, $Q_1$, and $Q_2$;

a1, a5, a8, a9, a11, and a12 are each independently integers of 0 to 4;

a2, a3, and a6 are each independently integers of 0 to 3;

a4 is an integer of 0 to 2; and a7 and a10 are each independently integers of 0 or 1, provided that at least one of a3, a4, a7, a8, a9, or a10 is not 0, and at least one of $R_3, R_4, R_7, R_8, R_9$, or $R_{10}$ is a deuterium atom, a halogen atom, a cyano group, a nitro group, a hydroxy group, a $C_1$-$C_{20}$ alkyl group, a cyclopropyl group, a cyclobutyl group, a cyclopentyl group, a cyclohexyl group, a cycloheptyl group, a cyclooctyl group, a cyclopentenyl group, a cyclopentadienyl group, a cyclohexenyl group, a cyclohexadienyl group, a cycloheptadienyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridyl group, a pyrazinyl group, a pyrimidinyl group, a pyridazinyl group, an isoindolyl group, an indolyl group, an indazolyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a furanyl group, a benzofuranyl group, a thiophenyl group, a thiazolyl group, an isothiazolyl group, a benzothiazolyl group, an isooxazolyl group, an oxazolyl group, a triazolyl group, a tetrazolyl group, an oxadiazolyl group, a triazinyl group, a benzooxazolyl group, a dibenzofuranyl group, a dibenzothiophenyl group, or —N(Q$_1$)(Q$_2$); or a $C_1$-$C_{20}$ alkyl group, a cyclopropyl group, a cyclobutyl group, a cyclopentyl group, a cyclohexyl group, a cycloheptyl group, a cyclooctyl group, a cyclopentenyl group, a cyclopentadienyl group, a cyclohexenyl group, a cyclohexadienyl group, a cycloheptadienyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridyl group, a pyrazinyl group, a pyrimidinyl group, a pyridazinyl group, an isoindolyl group, an indolyl group, an indazolyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a furanyl group, a benzofuranyl group, a thiophenyl group, a thiazolyl group, an isothiazolyl group, a benzothiazolyl group, an isooxazolyl group, an oxazolyl group, a triazolyl group, a tetrazolyl group, an oxadiazolyl group, a triazinyl group, a benzooxazolyl group, a dibenzofuranyl group, or a dibenzothiophenyl group, each substituted with at least one of a deuterium, a halogen atom, a hydroxyl group, a cyano group, a nitro group, a $C_1$-$C_{20}$ alkyl group, a $C_1$-$C_{20}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{30}$ aryl group, a $C_6$-$C_{30}$ aryloxy group, a $C_6$-$C_{30}$ arylthio group, or a $C_1$-$C_{30}$ heteroaryl group.

2. The organic light-emitting device as claimed in claim 1, wherein $Y_1$ and $Y_2$ are each independently selected from:
a hydrogen atom, a deuterium atom, a $C_1$-$C_{20}$ alkyl group, a cyclopropyl group, a cyclobutyl group, a cyclopentyl group, a cyclohexyl group, a cycloheptyl group, a cyclooctyl group, a cyclopentenyl group, a cyclopentadienyl group, a cyclohexenyl group, a cyclohexadienyl group, a cycloheptadienyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, and a hexacenyl group; and a $C_1$-$C_{20}$ alkyl group, a cyclopropyl group, a cyclobutyl group, a cyclopentyl group, a cyclohexyl group, a cycloheptyl group, a cyclooctyl group, a cyclopentenyl group, a cyclopentadienyl group, a cyclohexenyl group, a cyclohexadienyl group, a cycloheptadienyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, and a hexacenyl group, each substituted with at least one of a deuterium, a halogen atom, a hydroxyl group, a cyano group, a nitro group, a $C_1$-$C_{20}$ alkyl group, a $C_1$-$C_{20}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{30}$ aryl group, a $C_6$-$C_{30}$ aryloxy group, a $C_6$-$C_{30}$ arylthio group, and a $C_1$-$C_{30}$ heteroaryl group.

3. The organic light-emitting device as claimed in claim 1, wherein $Y_1$ and $Y_2$ are each independently selected from:
a phenyl group, a naphthyl group, a fluorenyl group, a spiro-fluorenyl group, a phenanthrenyl group, an anthryl group, a fluoranthenyl group, a triphenylenyl group, a pyrenyl group, and a chrysenyl group; and a phenyl group, a naphthyl group, a fluorenyl group, a spiro-fluorenyl group, a phenanthrenyl group, an anthryl group, a fluoranthenyl group, a triphenylenyl group, a pyrenyl group, and a chrysenyl group, each substituted with at least one of a deuterium, —F, a cyano group, a nitro group, a methyl group, an ethyl group, an n-propyl group, iso-propyl group, an n-butyl group, a sec-butyl group, iso-butyl group, a tert-butyl group, a phenyl group, a naphthyl group, and an anthryl group.

4. The organic light-emitting device as claimed in claim 1, wherein $Y_1$ and $Y_2$ are each independently selected from:
a phenyl group, a 1-naphthyl group, a 2-naphthyl group, a 1-fluorenyl group, a 2-fluorenyl group, a 3-fluorenyl group, and a 4-fluorenyl group; and a phenyl group, a 1-naphthyl group, a 2-naphthyl group, a 1-fluorenyl group, a 2-fluorenyl group, a 3-fluorenyl group, and a 4-fluorenyl group, each substituted with at least one of a deuterium, a methyl group, an ethyl group, a phenyl group, a 1-naphthyl group, and a 2-naphthyl group.

5. The organic light-emitting device as claimed in claim 1, wherein:
$Y_1$ and $Y_2$ are each independently represented by one of Formulae 4-1 to 4-4 below:

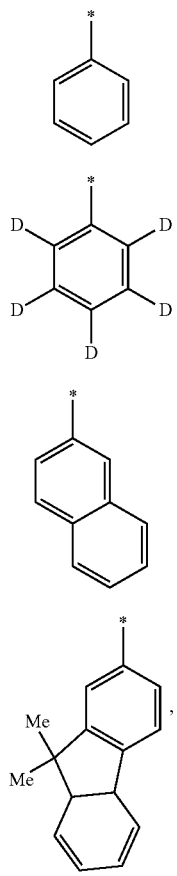

and
in Formulae 4-1 to 4-4, * is a binding site to an N of a carbazole ring.

6. The organic light-emitting device as claimed in claim 1, wherein:
$R_1$, $R_2$, $R_5$, $R_6$, $R_{11}$, and $R_{12}$ are each independently selected from:
a hydrogen atom, a deuterium atom, a halogen atom, a cyano group, a nitro group, a hydroxy group, $C_1$-$C_{20}$ alkyl group, a cyclopropyl group, a cyclobutyl group, a cyclopentyl group, a cyclohexyl group, a cycloheptyl group, a cyclooctyl group, a cyclopentenyl group, a cyclopentadienyl group, a cyclohexenyl group, a cyclohexadienyl group, a cycloheptadienyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridyl group, a pyrazinyl group, a pyrimidinyl group, a pyridazinyl group, an isoindolyl group, an indolyl group, an indazolyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a furanyl group, a benzofuranyl group, a thiophenyl group, a benzothiophenyl group, a thiazolyl group, an isothiazolyl group, a benzothiazolyl group, an isooxazolyl group, an oxazolyl group, a triazolyl group, a tetrazolyl group, an oxadiazolyl group, a triazinyl group, a benzooxazolyl group, a dibenzofuranyl group, a dibenzothiophenyl group, and —N($Q_1$)($Q_2$); and
a $C_1$-$C_{20}$ alkyl group, a cyclopropyl group, a cyclobutyl group, a cyclopentyl group, a cyclohexyl group, a cycloheptyl group, a cyclooctyl group, a cyclopentenyl group, a cyclopentadienyl group, a cyclohexenyl group, a cyclohexadienyl group, a cycloheptadienyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridyl group, a pyrazinyl group, a pyrimidinyl group, a pyridazinyl group, an isoindolyl group, an indolyl group, an indazolyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a furanyl group, a benzofuranyl group, a thiophenyl group, a benzothiophenyl group, a thiazolyl group, an isothiazolyl group, a benzothiazolyl group, an isooxazolyl group, an oxazolyl group, a triazolyl group, a tetrazolyl group, an oxadiazolyl group, a triazinyl group, a benzooxazolyl group, a dibenzofuranyl group, and a dibenzothiophenyl group, each substituted with at least one of a deuterium, a halogen atom, a hydroxyl group, a cyano group, a nitro group, a $C_1$-$C_{20}$ alkyl group, a $C_1$-$C_{20}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{30}$ aryl group, a $C_6$-$C_{30}$ aryloxy group, a $C_6$-$C_{30}$ arylthio group, and a $C_1$-$C_{30}$ heteroaryl group, and
$Q_1$ and $Q_2$ are each independently selected from a $C_6$-$C_{30}$ aryl group and a $C_1$-$C_{30}$ heteroaryl group.

7. The organic light-emitting device as claimed in claim 1, wherein:
$R_1$, $R_2$, $R_5$, $R_6$, $R_{11}$, and $R_{12}$ are each independently selected from:
a hydrogen atom, a deuterium atom, —F, a cyano group, a nitro group, a hydroxy group, a methyl group, an ethyl group, an n-propyl group, an iso-propyl group, an n-butyl group, a sec-butyl group, an iso-butyl group, a tert-butyl group, a cyclopentyl group, a cyclohexyl group, a cyclopentenyl group, a cyclohexenyl group, a cycloheptadienyl group, a phenyl group, a naphthyl group, a fluorenyl group, a spiro-fluorenyl group, a phenanthrenyl group, an anthryl group, a triphenylenyl group, a pyrenyl group, a chrysenyl group, a pyrrolyl group, an imidazolyl group, a pyrazolyl group, a pyridyl group, a pyrazinyl group, a pyrimidinyl group, a pyridazinyl group, an isoindolyl group, an indolyl group, a quinolinyl group, a carbazolyl group, a furanyl group, a benzofuranyl group, a thiophenyl group, a benzothiophenyl group, a thiazolyl group, a benzothiazolyl group, a triazolyl group, a tetrazolyl group, a triazinyl group, and —N($Q_1$)($Q_2$); and a phenyl group, a naphthyl group, a fluorenyl group, a spiro-fluorenyl group, a phenanthrenyl group, an anthryl group, a triphenylenyl group, a pyrenyl group, a chrysenyl group, a pyrrolyl group, an imidazolyl group, a pyrazolyl group, a pyridyl group, a pyrazinyl group, a pyrimidinyl group, a pyridazinyl group, an isoindolyl group, an indolyl group, a quinolinyl group, a carbazolyl group, a furanyl group, a benzofuranyl group, a thiophenyl group, a benzothiophenyl group, a thiazolyl group, a benzothiazolyl group, a triazolyl group, a tetrazolyl group, and a triazinyl group, each substituted with at least one of a deuterium, —F, a cyano group, a nitro group, a methyl group, an ethyl group, an n-propyl group, iso-propyl group, an n-butyl group, a sec-butyl group, iso-butyl group, a tert-butyl group, a phenyl group, a naphthyl group, and an anthryl group, $R_3$, $R_4$, $R_7$, $R_8$, $R_9$ and $R_{10}$ are each independently selected from:

a hydrogen atom, a deuterium atom, —F, a cyano group, a nitro group, a hydroxy group, a methyl group, an ethyl group, an n-propyl group, an iso-propyl group, an n-butyl group, a sec-butyl group, an iso-butyl group, a tert-butyl group, a cyclopentyl group, a cyclohexyl group, a cyclopentenyl group, a cyclohexenyl group, a cycloheptadienyl group, a phenyl group, a naphthyl group, a fluorenyl group, a spiro-fluorenyl group, a phenanthrenyl group, an anthryl group, a triphenylenyl group, a pyrenyl group, a chrysenyl group, a pyrrolyl group, an imidazolyl group, a pyrazolyl group, a pyridyl group, a pyrazinyl group, a pyrimidinyl group, a pyridazinyl group, an isoindolyl group, an indolyl group, a quinolinyl group, a carbazolyl group, a furanyl group, a benzofuranyl group, a thiophenyl group, a benzothiophenyl group, a thiazolyl group, a benzothiazolyl group, a triazolyl group, a tetrazolyl group, a triazinyl group, and —N($Q_1$)($Q_2$); and a phenyl group, a naphthyl group, a fluorenyl group, a spiro-fluorenyl group, a phenanthrenyl group, an anthryl group, a triphenylenyl group, a pyrenyl group, a chrysenyl group, a pyrrolyl group, an imidazolyl group, a pyrazolyl group, a pyridyl group, a pyrazinyl group, a pyrimidinyl group, a pyridazinyl group, an isoindolyl group, an indolyl group, a quinolinyl group, a carbazolyl group, a furanyl group, a benzofuranyl group, a thiophenyl group, a thiazolyl group, a benzothiazolyl group, a triazolyl group, a tetrazolyl group, and a triazinyl group, each substituted with at least one of a deuterium, —F, a cyano group, a nitro group, a methyl group, an ethyl group, an n-propyl group, iso-propyl group, an n-butyl group, a sec-butyl group, iso-butyl group, a tert-butyl group, a phenyl group, a naphthyl group, and an anthryl group, and $Q_1$ and $Q_2$ are each independently selected from a phenyl group, a naphthyl group, an anthryl group, and a fluorenyl group.

8. The organic light-emitting device as claimed in claim 1, wherein: $R_1$ to $R_{12}$ are each independently selected from:

a hydrogen atom, a deuterium atom, —F, a cyano group, a nitro group, a methyl group, an ethyl group, a phenyl group, a 1-naphthyl group, a 2-naphthyl group, a 1-fluorenyl group, a 2-fluorenyl group, a 3-fluorenyl group, a 4-fluorenyl group, a 1-carbazolyl group, a 2-carbazolyl group, a 3-carbazolyl group, a 4-carbazolyl group, and —N($Q_1$)($Q_2$);

a phenyl group, a 1-naphthyl group, a 2-naphthyl group, a 1-fluorenyl group, a 2-fluorenyl group, a 3-fluorenyl group, a 4-fluorenyl group, a 1-carbazolyl group, a 2-carbazolyl group, a 3-carbazolyl group, and a 4-carbazolyl group, each substituted with at least one of a deuterium, —F, a cyano group, a nitro group, a methyl group, an ethyl group, a phenyl group, a naphthyl group, and an anthryl group, and $Q_1$ and $Q_2$ are each independently selected from a phenyl group, and a naphthyl group.

9. The organic light-emitting device as claimed in claim 1, wherein:

$R_1$ to $R_{12}$ are each independently represented by one of the following Formulae 5-1 to 5-8:

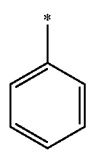

5-1

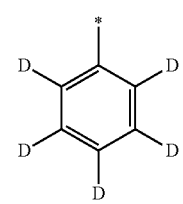

5-2

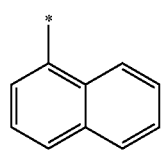

5-3

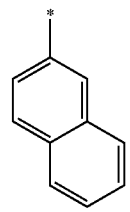

5-4

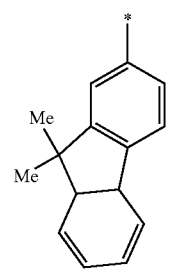

5-5

5-6
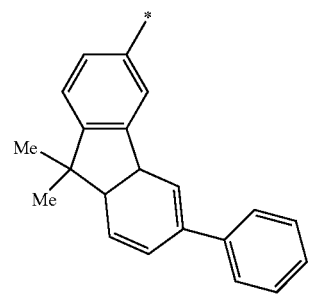
5-7
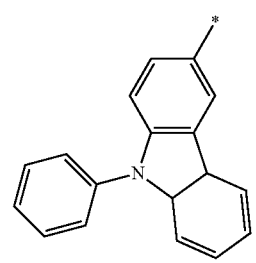
5-8
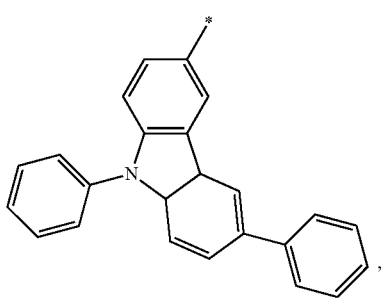
and
in Formulae 5-1 to 5-8, * is a binding site.
10. The organic light-emitting device as claimed in claim 1, wherein:
the carbazole-based compound is represented by one of the following Formulae 1a to 1d, 2a to 2d, and 3:
<Formula 1a>
<Formula 1b>
<Formula 1c>
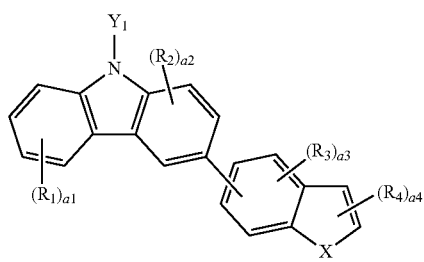
<Formula 1d>
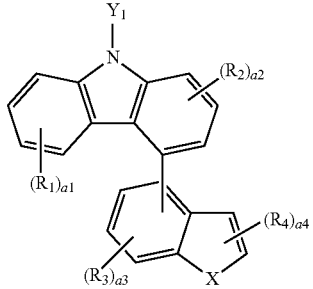
<Formula 2a>
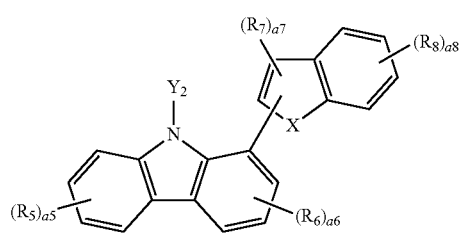
<Formula 2b>
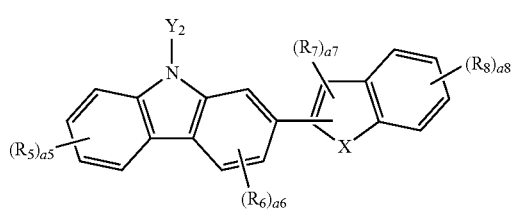
<Formula 2c>
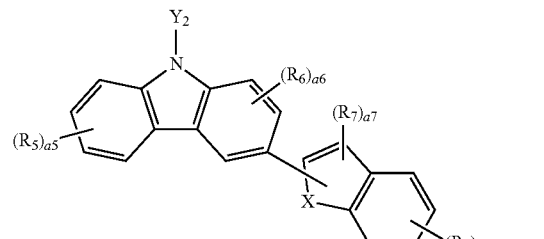
<Formula 2d>
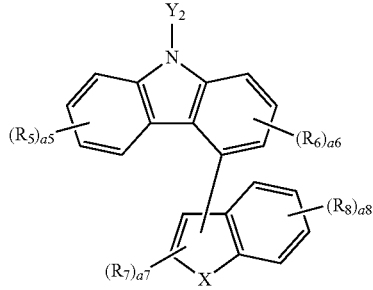

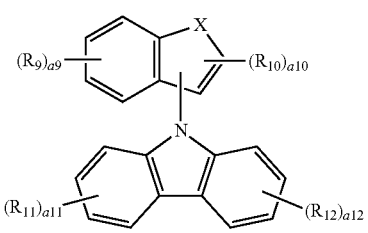
<Formula 3>

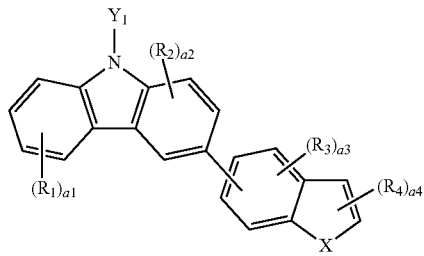
<Formula 1c>

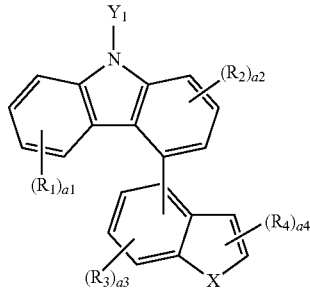
<Formula 1d> in Formulae 1a to 1d, 2a to 2d, and 3:
X is an oxygen atom or a sulfur atom;
$Y_1$ and $Y_2$ are each independently selected from:
a phenyl group, a 1-naphthyl group, a 2-naphthyl group, a 1-fluorenyl group, a 2-fluorenyl group, a 3-fluorenyl group, and a 4-fluorenyl group; and
a phenyl group, a 1-naphthyl group, a 2-naphthyl group, a 1-fluorenyl group, a 2-fluorenyl group, a 3-fluorenyl group, and a 4-fluorenyl group, each substituted with at least one of a deuterium, a methyl group, an ethyl group, a phenyl group, a 1-naphthyl group, and a 2-naphthyl group;
$R_1$ to $R_{12}$ are each independently selected from:
a hydrogen atom, a deuterium atom, an —F, a cyano group, a nitro group, a methyl group, an ethyl group, a phenyl group, a naphthyl group, a fluorenyl group, a carbazolyl group and —N($Q_1$)($Q_2$); and
a phenyl group, a naphthyl group, a fluorenyl group, and a carbazolyl group, each substituted with at least one of a deuterium, an —F, a cyano group, a nitro group, a methyl group, an ethyl group, a phenyl group, a naphthyl group, and an anthryl group; a1, a5, a8, a9, a11, and a12 are each independently integers of 0 to 4;
$Q_1$ and $Q_2$ are each independently selected from a phenyl group, and a naphthyl group;
a2, a3, and a6 are each independently integers of 0 to 3;
a4 is an integer of 0 to 2; and
a7 and a10 are each independently integers of 0 or 1.

11. The organic light-emitting device as claimed in claim 1, wherein:
the carbazole-based compound is represented by one of the following Formulae 1a to 1d, 2a to 2d, and 3:

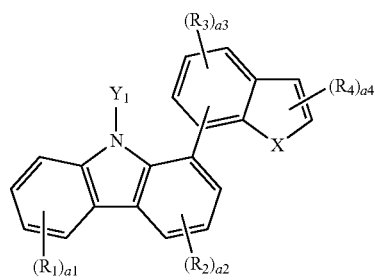
<Formula 1a>

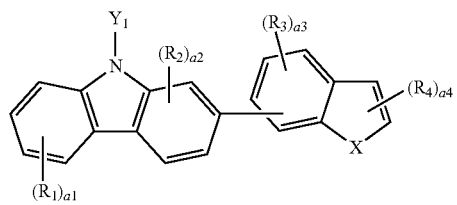
<Formula 1b>

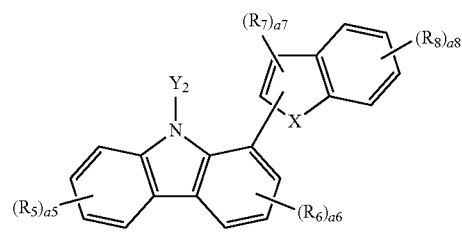
<Formula 2a>

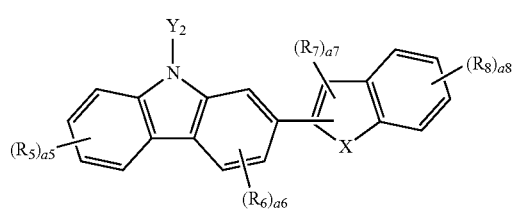
<Formula 2b>

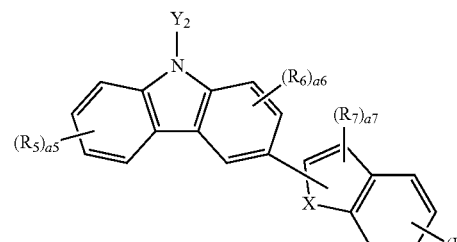
<Formula 2c>

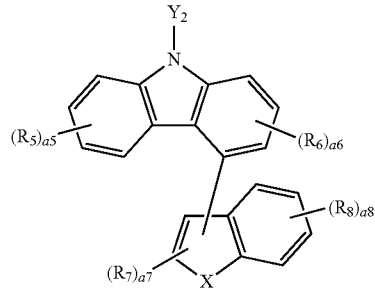
<Formula 2d>

-continued
<Formula 3>
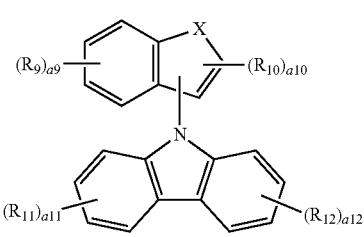
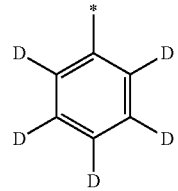
5-2
in Formulae 1a to 1d, 2a to 2d, and 3:
X is an oxygen atom or a sulfur atom;
$Y_1$ and $Y_2$ are each independently represented by one of the following Formulae 4-1 to 4-4:
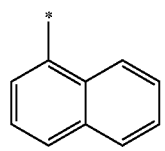
5-3
4-1
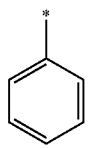
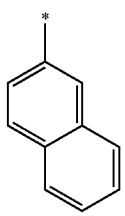
5-4
4-2
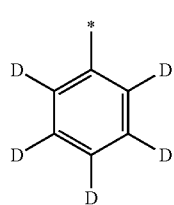
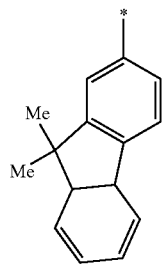
5-5
4-3
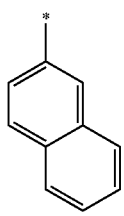
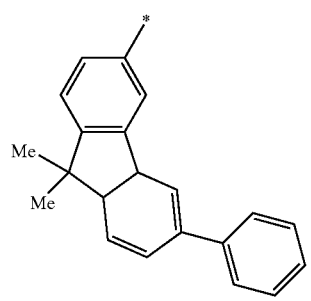
5-6
4-4
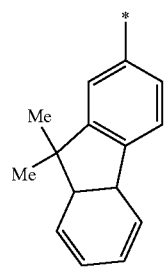
in Formulae 4-1 to 4-4, * is a binding site to N of a carbazole;
$R_1$ to $R_{12}$ are each independently represented by one of Formulae 5-1 to 5-8:
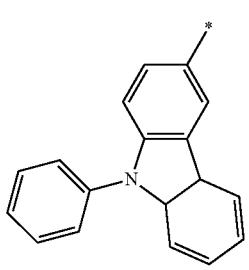
5-7
5-1
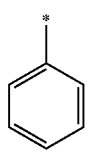

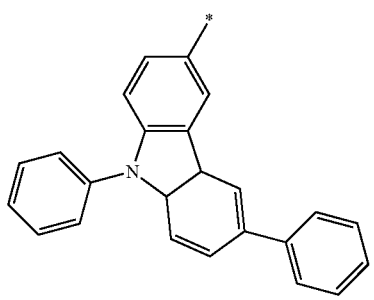

5-8 in Formulae 5-1 to 5-8, * is a binding site;

a1, a5, a8, a9, a11, and a12 are each independently integers of 0 to 4;

a2, a3, and a6 are each independently integers of 0 to 3;

a4 is an integer of 0 to 2; and a7 and a10 are each independently integers of 0 or 1.

12. The organic light-emitting device as claimed in claim 1, wherein:

the carbazole-based compound is represented by one of the following Formulae 1e to 1h, 2e to 2h, and 3a:

<Formula 1e>

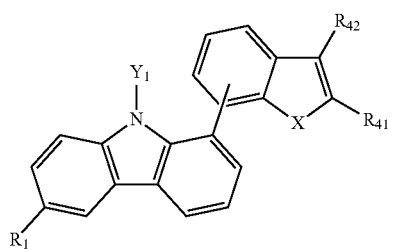

<Formula 1f>

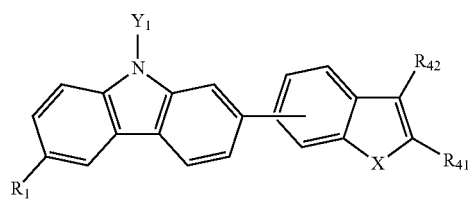

<Formula 1g>

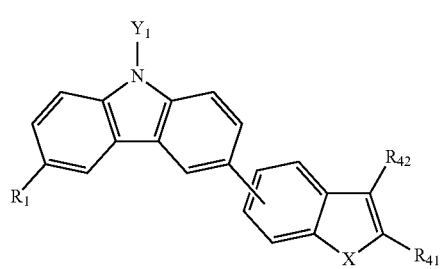

<Formula 1h>

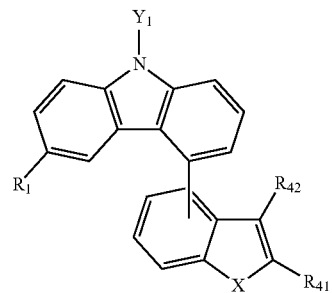

<Formula 2e>

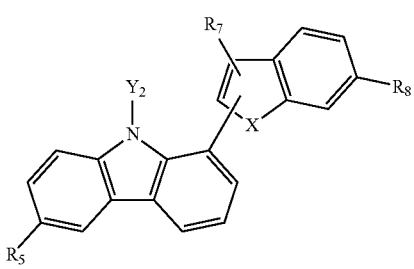

<Formula 2f>

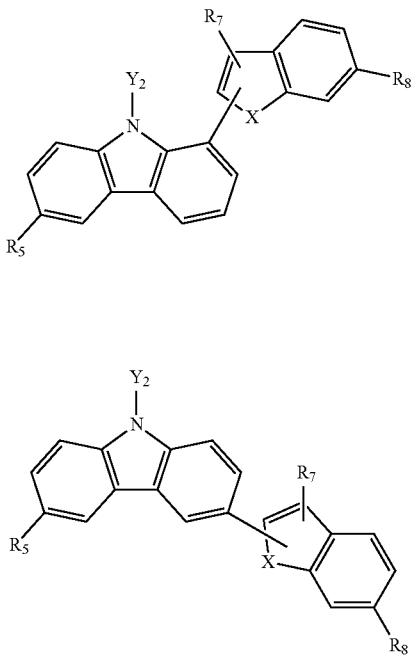

<Formula 2g>

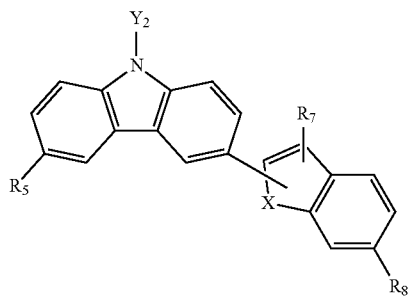

<Formula 2h>

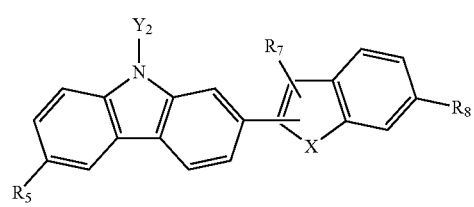

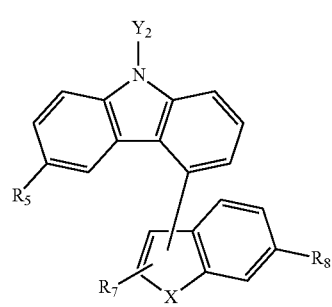

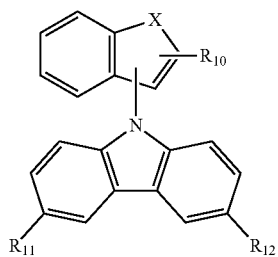

<Formula 3a> in Formulae 1e to 1h, 2e to 2h, and 3a:

X is an oxygen atom or a sulfur atom;

$Y_1$ and $Y_2$ are each independently selected from:

a phenyl group, a 1-naphthyl group, a 2-naphthyl group, a 1-fluorenyl group, a 2-fluorenyl group, a 3-fluorenyl group, and a 4-fluorenyl group; and a phenyl group, a 1-naphthyl group, a 2-naphthyl group, a 1-fluorenyl group, a 2-fluorenyl group, a 3-fluorenyl group, and a 4-fluorenyl group, each substituted with at least one of a deuterium, a methyl group, an ethyl group, a phenyl group, 1-naphthyl group and 2-naphthyl group;

$R_1$, $R_5$, $R_7$, $R_8$, $R_{10}$, $R_{11}$, $R_{12}$, $R_{41}$ and $R_{42}$ are each independently selected from:

a hydrogen atom, a deuterium atom, —F, a cyano group, a nitro group, a methyl group, an ethyl group, a phenyl group, a naphthyl group, a fluorenyl group, a carbazolyl group, and —$N(Q_1)(Q_2)$, in which $Q_1$ and $Q_2$ are each independently a phenyl group or a naphthyl group; and a phenyl group, a naphthyl group, a fluorenyl group, and a carbazolyl group, each substituted with at least one of a deuterium, —F, a cyano group, a nitro group, a methyl group, an ethyl group, a phenyl group, a naphthyl group, and an anthryl group.

13. The organic light-emitting device as claimed in claim 1, wherein:

the carbazole-based compound is represented by one of Formulae 1e to 1h, 2e to 2h, and 3a:

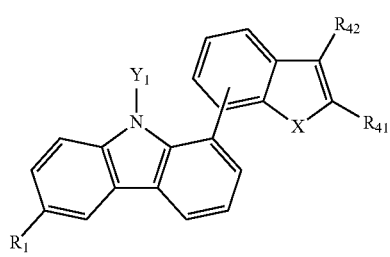

<Formula 1e>

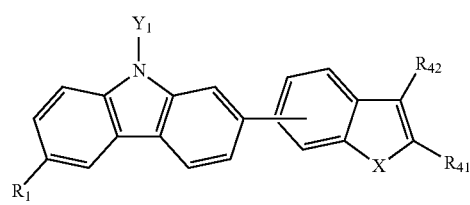

<Formula 1f>

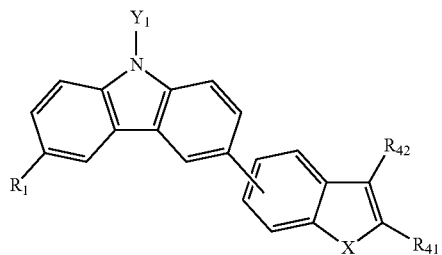

<Formula 1g>

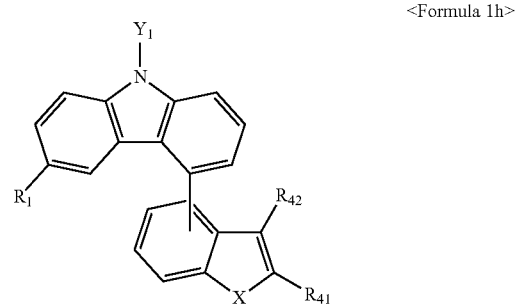

<Formula 1h>

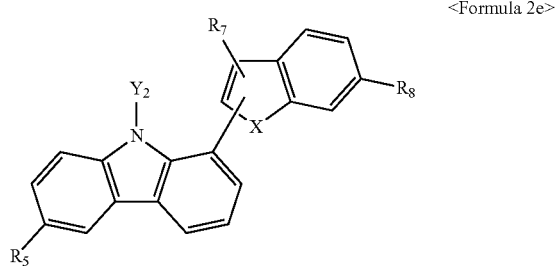

<Formula 2e>

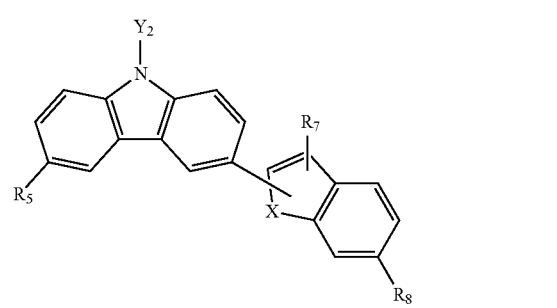

<Formula 2f>

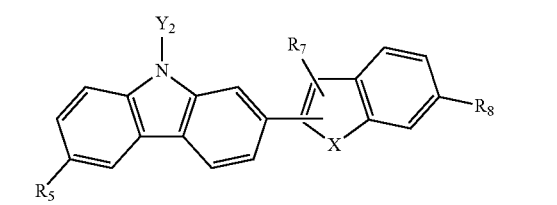

<Formula 2g>

-continued
<Formula 2h>
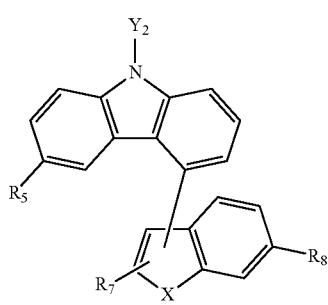
<Formula 3a>
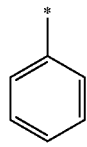
in Formulae 1e to 1h, 2e to 2h, and 3a:
X is an oxygen atom or a sulfur atom;
$Y_1$ and $Y_2$ are each independently represented by one of the following Formulae 4-1 to 4-4:
4-1
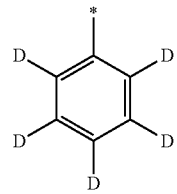
4-2
4-3
4-4
in Formulae 4-1 to 4-4, * is a binding site to N of a carbazole ring; and
$R_1$, $R_5$, $R_7$, $R_8$, $R_{11}$, $R_{10}$, $R_{12}$, $R_{41}$, and $R_{42}$ are each independently represented by one of the following Formulae 5-1 to 5-8:
5-1
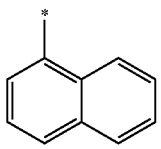
5-2
5-3
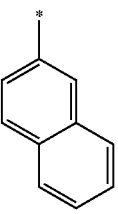
5-4
5-5
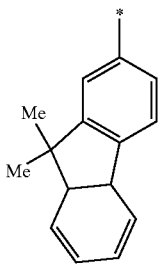
5-6
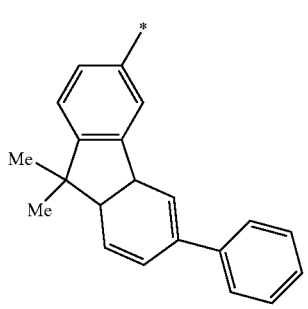

-continued 5-7

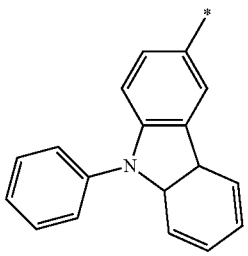

5-8

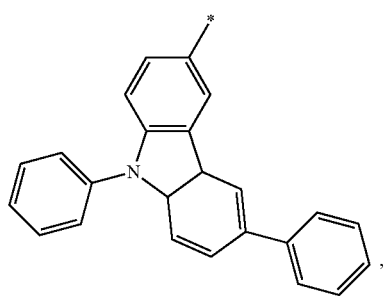

and in Formulae 5-1 to 5-8, * is a binding site.

14. The organic light-emitting device as claimed in claim 1, wherein:

the carbazole-based compound is represented by one of the following Formulae 1i, 1j, 2i, and 3b:

<Formula 1i>

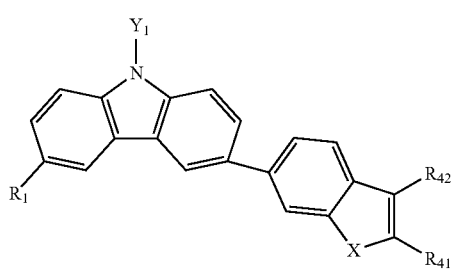

<Formula 1j>

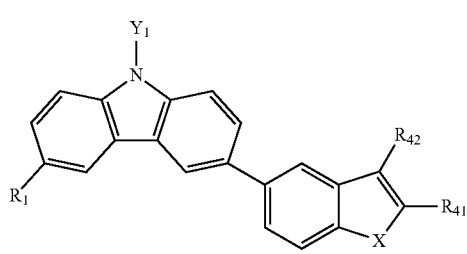

-continued

<Formula 2i>

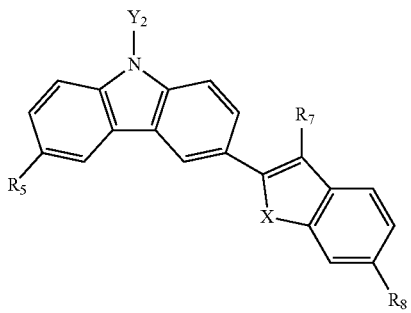

<Formula 3b>

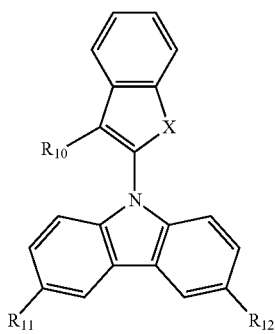

in Formulae 1i, 1j, 2i, and 3b:

X is an oxygen atom or a sulfur atom;

$Y_1$ and $Y_2$ are each independently selected from:

a phenyl group, a 1-naphthyl group, a 2-naphthyl group, a 1-fluorenyl group, a 2-fluorenyl group, a 3-fluorenyl group, and a 4-fluorenyl group; and a phenyl group, a 1-naphthyl group, a 2-naphthyl group, a 1-fluorenyl group, a 2-fluorenyl group, a 3-fluorenyl group, and a 4-fluorenyl group, each substituted with at least one of a deuterium, a methyl group, an ethyl group, a phenyl group, 1-naphthyl group and 2-naphthyl group;

$R_1$, $R_5$, $R_7$, $R_8$, $R_{10}$, $R_{11}$, $R_{12}$, $R_{41}$ and $R_{42}$ are each independently selected from:

a hydrogen atom, a deuterium atom, —F, a cyano group, a nitro group, a methyl group, an ethyl group, a phenyl group, a naphthyl group, a fluorenyl group, a carbazolyl group and —N($Q_1$)($Q_2$); and a phenyl group, a naphthyl group, a fluorenyl group and a carbazolyl group, each substituted with at least one of a deuterium, —F, a cyano group, a nitro group, a methyl group, an ethyl group, a phenyl group, a naphthyl group, and an anthryl group, and $Q_1$ and $Q_2$ are each independently selected from a phenyl group and a naphthyl group.

15. The organic light-emitting device as claimed in claim 1, wherein:

the carbazole-based compound is represented by one of the following Formulae 1i, 1j, 2i, and 3b:

<Formula 1i>
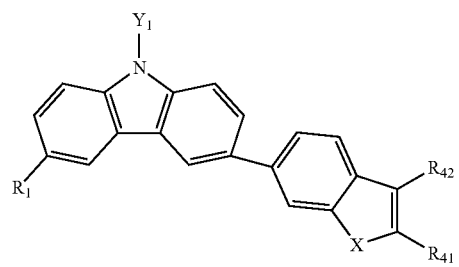
<Formula 1j>
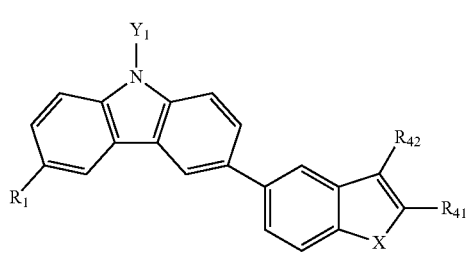
<Formula 2i>
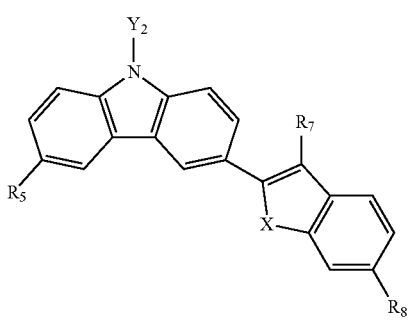
<Formula 3b>
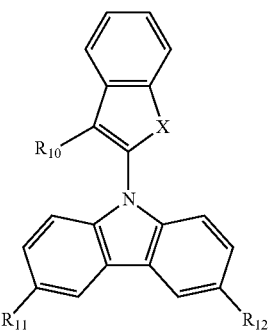
in Formulae 1i, 1j, 2i, and 3b:
X is an oxygen atom or a sulfur atom;
$Y_1$ and $Y_2$ are each independently represented by one of the following Formula 4-1 to 4-4:
4-1
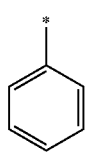
4-2
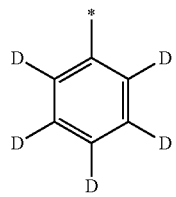
4-3
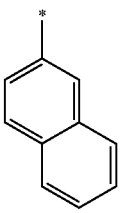
4-4
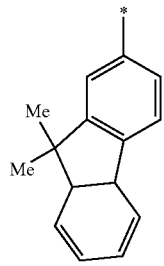
in Formulae 4-1 to 4-4, * is a binding site to N of a carbazole ring;
$R_1$, $R_5$, $R_7$, $R_8$, $R_{10}$, $R_{11}$, $R_{12}$, $R_{41}$, and $R_{42}$ are each independently represented by one of Formulae 5-1 to 5-8:
5-1
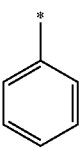
5-2
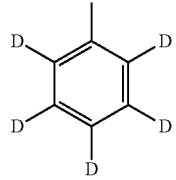
5-3
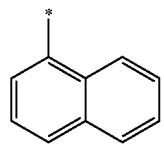
5-4
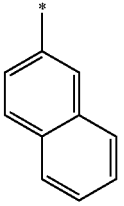

5-5
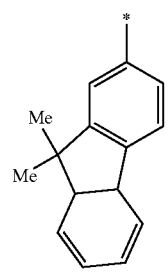
5-6
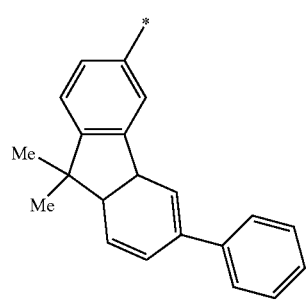
5-7
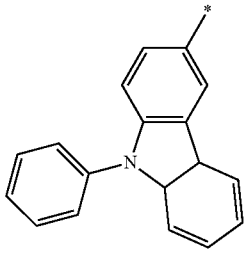
5-8
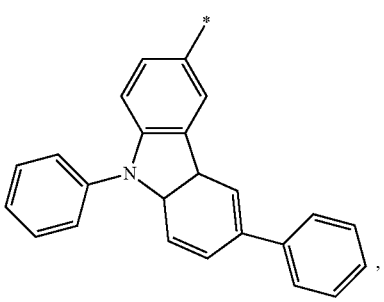
and
in Formulae 5-1 to 5-8, * is a binding site.
16. The organic light-emitting device as claimed in claim 1, wherein the carbazole-based compound is one of Compounds 1 to 9:
[Compound 1]
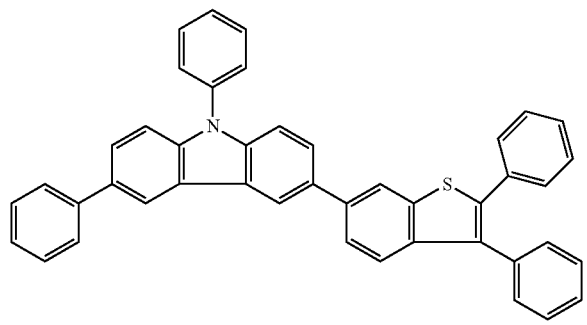
[Compound 2]
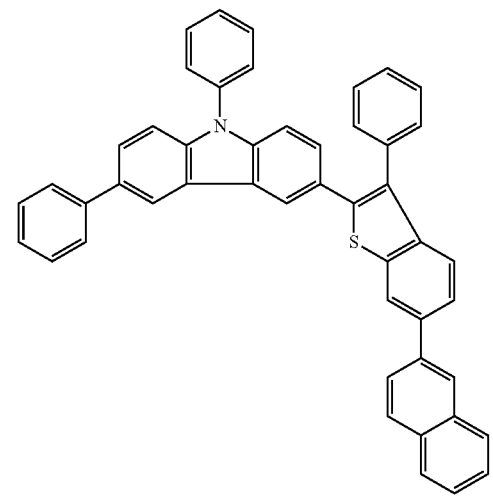
[Compound 3]
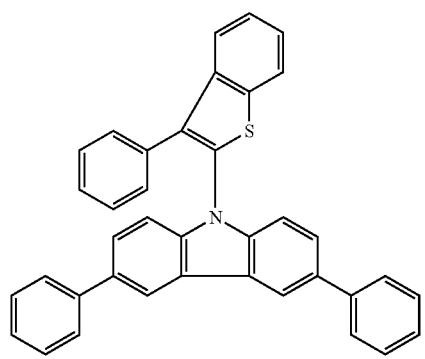
[Compound 4]
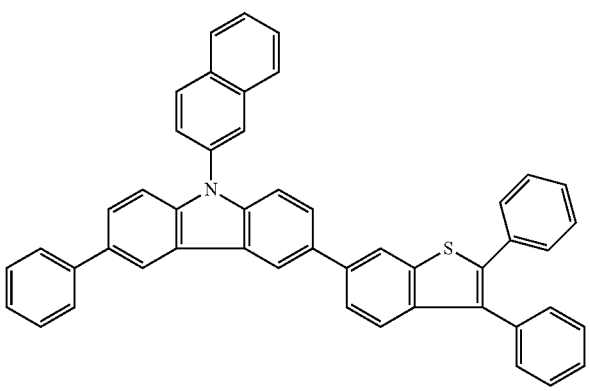

[Compound 5]
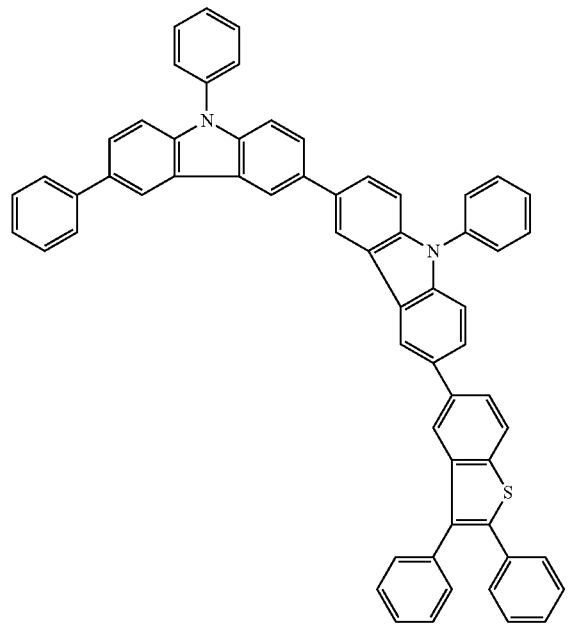
[Compound 6]
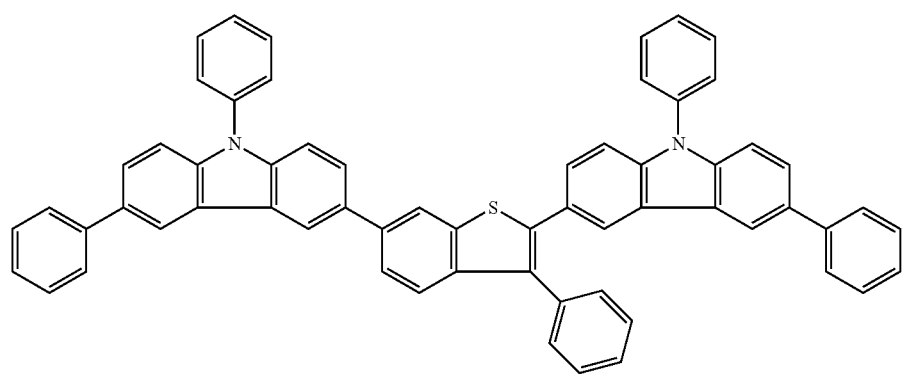
[Compound 7]
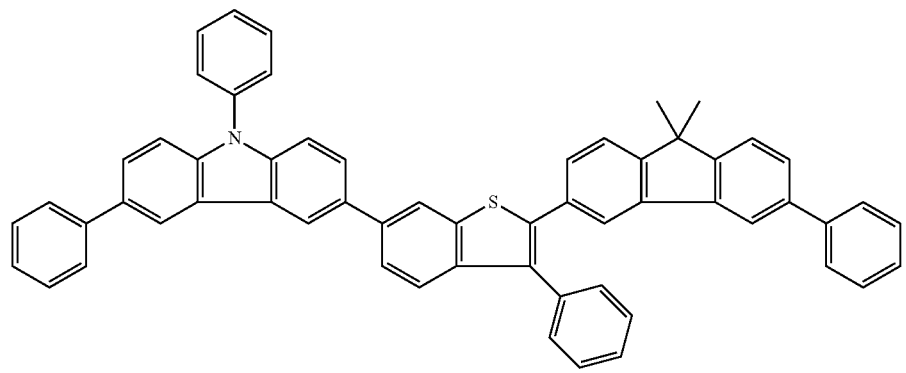

-continued

[Compound 8]

[Compound 9]

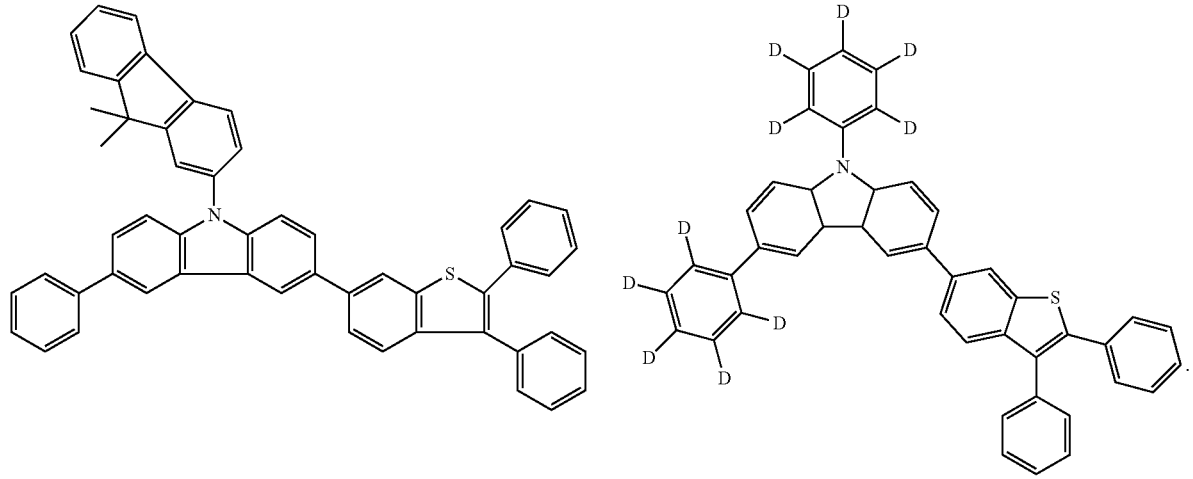

17. The organic light-emitting device as claimed in claim 1, wherein the organic layer includes:

a hole-transporting region between the first electrode and the emission layer, the hole-transporting region including at least one of hole injection layer, a hole transport layer, a functional layer having both hole injecting and hole transporting capabilities, and a buffer layer, and an electron transport region between the emission layer and the second electrode, the electron transport region including at least one of an electron transport layer and an electron injection layer.

* * * * *